United States Patent
Park et al.

(10) Patent No.: US 9,953,712 B2
(45) Date of Patent: Apr. 24, 2018

(54) NONVOLATILE MEMORY DEVICE AND STORAGE DEVICE INCLUDING THE NONVOLATILE MEMORY DEVICE

(71) Applicant: SAMSUNG ELECTRONICS CO., LTD., Suwon-si, Gyeonggi-Do (KR)

(72) Inventors: Jong-Chul Park, Hwaseong-si (KR); Seung-Bum Kim, Hwaseong-si (KR); Myung-Hoon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/680,104

(22) Filed: Aug. 17, 2017

(65) Prior Publication Data

US 2017/0345507 A1    Nov. 30, 2017

Related U.S. Application Data

(62) Division of application No. 14/964,056, filed on Dec. 9, 2015, now Pat. No. 9,773,560.

(30) Foreign Application Priority Data

May 20, 2015    (KR) .................. 10-2015-0070623

(51) Int. Cl.
| | |
|---|---|
| *G11C 16/08* | (2006.01) |
| *G11C 16/14* | (2006.01) |
| *G11C 16/34* | (2006.01) |
| *G11C 16/16* | (2006.01) |
| *G11C 16/10* | (2006.01) |

(52) U.S. Cl.
CPC .............. *G11C 16/14* (2013.01); *G11C 16/10* (2013.01); *G11C 16/16* (2013.01); *G11C 16/3445* (2013.01); *G11C 16/3459* (2013.01); *G11C 16/3477* (2013.01); *G11C 16/08* (2013.01)

(58) Field of Classification Search
CPC .......... G11C 16/08; G11C 16/10; G11C 16/16
USPC ..................................... 365/185.11
See application file for complete search history.

(56) References Cited

U.S. PATENT DOCUMENTS

| | | | |
|---|---|---|---|
| 7,679,133 B2 | 3/2010 | Son et al. | |
| 7,808,829 B2 | 10/2010 | Lee | |
| 7,848,150 B2 | 12/2010 | Lee et al. | |
| 8,130,551 B2 | 3/2012 | Oowada et al. | |
| 8,259,504 B2 | 9/2012 | Ting et al. | |
| 8,553,466 B2 | 10/2013 | Han et al. | |

(Continued)

FOREIGN PATENT DOCUMENTS

| | | |
|---|---|---|
| KR | 1020090007861 | 1/2009 |
| KR | 1020120043515 | 10/2010 |

*Primary Examiner* — Jason Lappas
(74) *Attorney, Agent, or Firm* — Volentine & Whitt, PLLC

(57) ABSTRACT

A nonvolatile memory device includes a memory cell array having memory cells, a row decoder circuit connected to the memory cells through word lines, a page buffer circuit connected to the memory cells through bit lines, and a control circuit controlling the row decoder circuit and the page buffer circuit to repeatedly perform an erase loop including an erase and an erase verification with respect to the memory cells. The control circuit is configured to select one of an increase and a decrease of an erase voltage according to a result of the erase verification of a current erase loop and apply the controlled erase voltage to the memory cells in the erase operation of a subsequent erase loop.

12 Claims, 24 Drawing Sheets

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 8,705,283 B2 | 4/2014 | Ferragina et al. |
| 8,850,292 B2 | 9/2014 | Lee |
| 8,879,333 B2 | 11/2014 | Costa et al. |
| 8,971,125 B2 | 3/2015 | He |
| 9,105,336 B2 | 8/2015 | Shiino et al. |
| 2010/0110796 A1 | 5/2010 | Park et al. |
| 2010/0124121 A1 | 5/2010 | Seo |
| 2011/0233648 A1 | 9/2011 | Seol et al. |
| 2012/0213005 A1* | 8/2012 | Lee .................. G11C 16/14 365/185.11 |
| 2014/0247666 A1 | 9/2014 | Dutta et al. |

* cited by examiner

FIG. 2
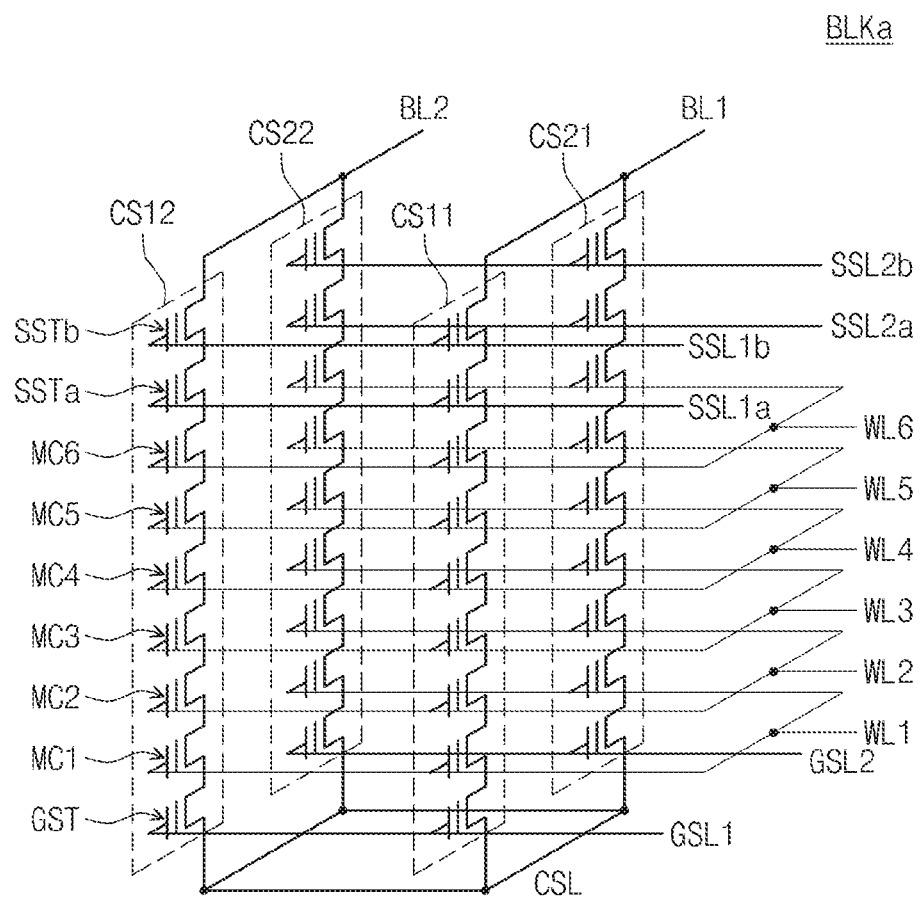
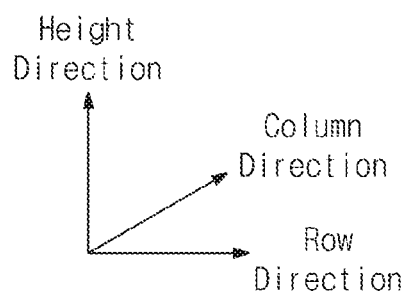

FIG. 7
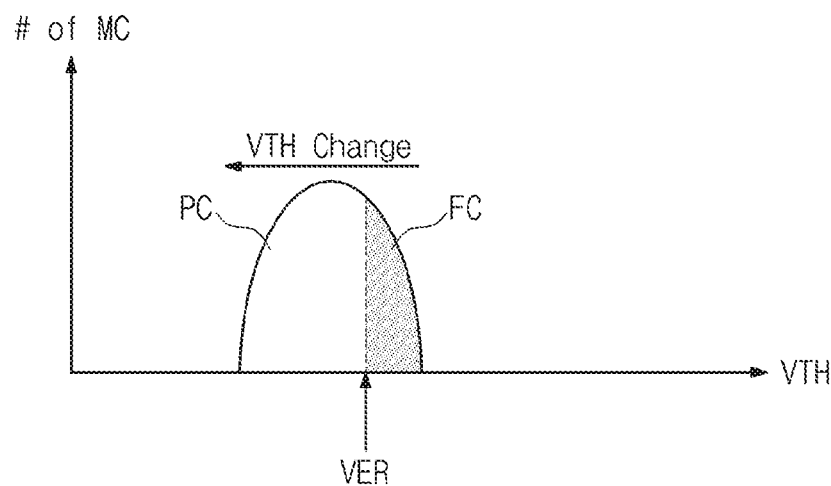
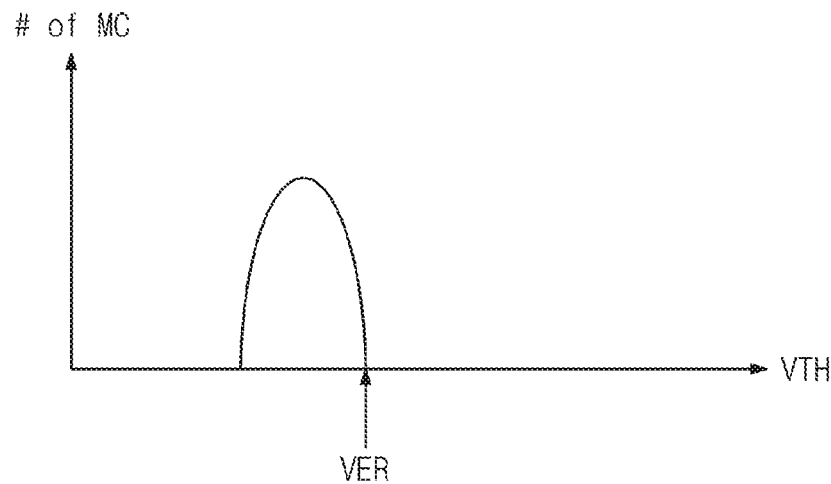

NONVOLATILE MEMORY DEVICE AND STORAGE DEVICE INCLUDING THE NONVOLATILE MEMORY DEVICE

CROSS-REFERENCE TO RELATED APPLICATIONS

This is a Divisional of U.S. application Ser. No. 14/964,056, filed Dec. 9, 2015, a U.S. non-provisional patent application claims priority under 35 U.S.C. § 119 of Korean Patent Application No. 10-2015-0070623, filed on May 20, 2015, the entire contents of which are hereby incorporated by reference.

BACKGROUND

The disclosure relates to semiconductor devices, and more particularly, to a nonvolatile memory device and a storage device including the nonvolatile memory device.

A storage device is a device storing data under the control of a host device such as a computer, a smart phone, a smart pad, etc. A storage device includes a device storing data in a magnetic disk such as a HDD (hard disk drive) and a device storing data in a semiconductor memory, in particular, a nonvolatile memory such as a SSD (solid state drive), a memory card, etc.

Examples of a nonvolatile memory include a ROM (read only memory), a PROM (programmable ROM), an EPROM (electrically programmable ROM), an EEPROM (electrically erasable and programmable ROM), a flash memory, a PRAM (phase-change RAM), a MRAM (magnetic RAM), a RRAM (resistive RAM), a FRAM (ferroelectric RAM), etc.

As semiconductor manufacturing technology develops, high integration and a higher capacity of a storage device are continuously proceeding. A high integration of a storage device has an advantage of reducing its production cost. However, as a scale of the storage device is reduced and its structure is changed due to the high integration of the storage device, various problems that were not previously known are being found. The various problems being newly found may damage data stored in the storage device and thereby reliability of the storage device may be degraded. A requirement for a method and a device that can improve reliability of the storage device is continuously being suggested.

SUMMARY

Embodiments of the disclosure provide a nonvolatile memory device. The nonvolatile memory device may include a memory cell array including memory cells, a row decoder circuit connected to the memory cells through word lines, a page buffer circuit connected to the memory cells through bit lines, and a control circuit controlling the row decoder circuit and the page buffer circuit to repeatedly perform an erase loop including an erase and an erase verification with respect to the memory cells. The control circuit is configured to select one of an increase and a decrease of an erase voltage according to a result of the erase verification of a current erase loop and apply the controlled erase voltage to the memory cells in the erase operation of a subsequent erase loop.

Embodiments of the disclosure also provide a nonvolatile memory device. The nonvolatile memory device may include a memory cell array including memory cells, a row decoder circuit connected to the memory cells through word lines, a page buffer circuit connected to the memory cells through bit lines, and a control circuit controlling the row decoder circuit and the page buffer circuit to repeatedly perform an erase loop including an erase and an erase verification with respect to the memory cells. The control circuit is configured to control an erase voltage on the basis of at least one of the number of erase failed memory cells and the number of erase passed memory cells in the erase verification of a first erase loop, and to apply the controlled erase voltage to the memory cells in the erase of a second erase loop.

Embodiments of the disclosure also provide a storage device. The storage device may include a nonvolatile memory device and a controller configured to control the nonvolatile memory device. The nonvolatile memory device is configured to output an erase verification result to the controller, control an erase voltage according to a control method being received from the controller, and perform an erase loop using the erase voltage. The controller is configured to select the control method with respect to the erase voltage based on the erase verification result being received from the nonvolatile memory device and transmit the control method to the nonvolatile memory device.

Embodiments of the disclosure also provide a nonvolatile memory device including a memory cell array having memory cells and a controller that repeatedly performs an operational loop. The operational loop includes a voltage application operation and a verification operation that are executed on the memory cells. The controller: determines the extent of success achieved by the voltage application operation of a current operational loop from the verification operation of the current operational loop, selects an increase, a decrease, or no change of a controlled voltage, to be applied in a subsequent operational loop, according to the determined extent of success, and applies the controlled voltage to the memory cells in the voltage application operation of the subsequent operational loop.

BRIEF DESCRIPTION OF THE FIGURES

Preferred embodiments of the disclosure will be described below in more detail with reference to the accompanying drawings. The embodiments of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

FIG. 2 is a circuit diagram illustrating a memory block in accordance with some embodiments of the disclosure.

FIG. 7 illustrates a change of a threshold voltage distribution of memory cells being erased according to some embodiments of the disclosure.

DETAILED DESCRIPTION

Figure 1:
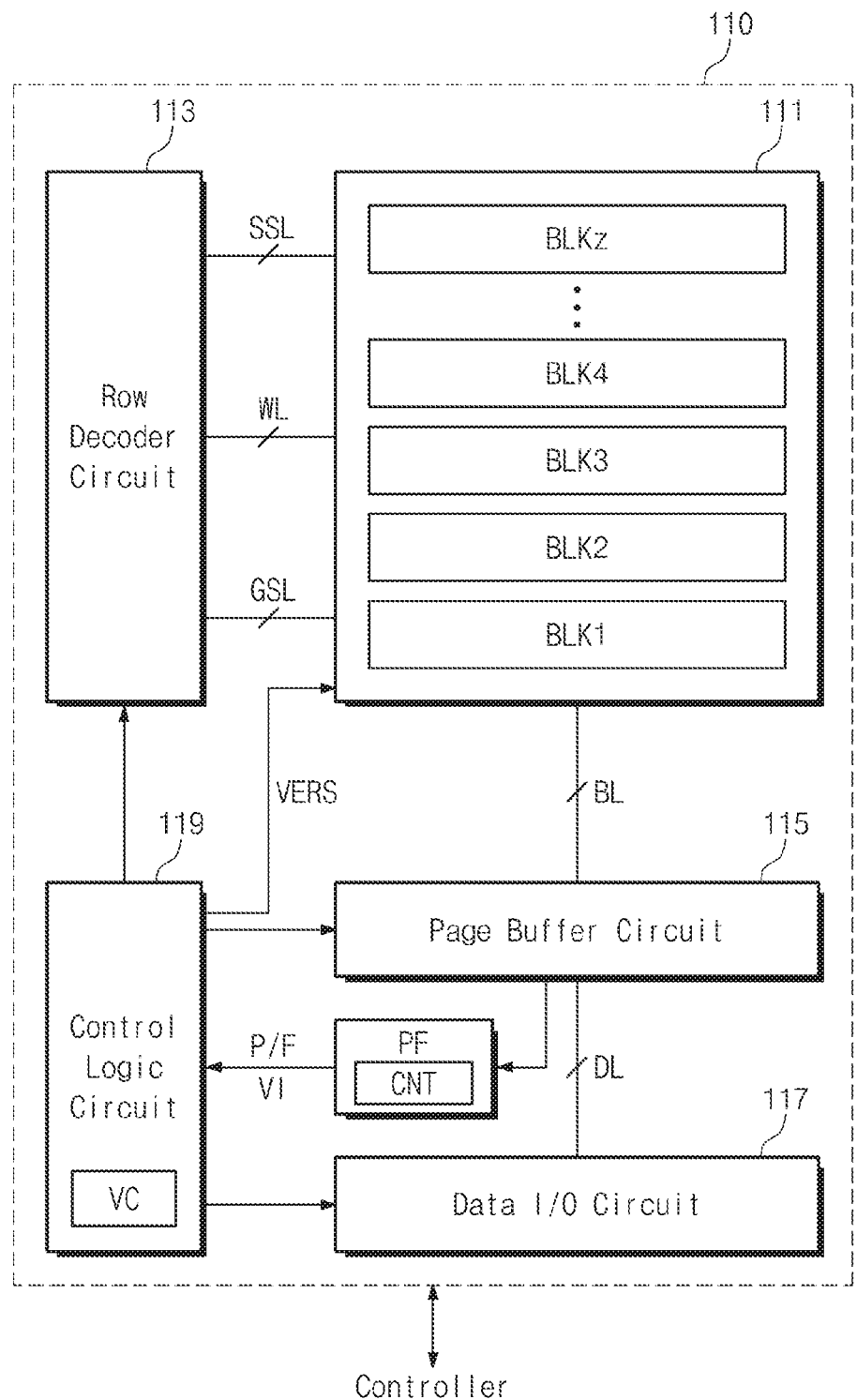
FIG. 1 is a block diagram illustrating a nonvolatile memory device in accordance with some embodiments of the disclosure.

Embodiments of disclosure will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

FIG. 1 is a block diagram illustrating a nonvolatile memory device in accordance with some embodiments of the disclosure. Referring to FIG. 1, a nonvolatile memory device 110 includes a memory cell array 111, a row decoder circuit 113, a page buffer circuit 115, a data input/output circuit 117, and a control logic circuit 119.

The memory cell array 111 includes a plurality of memory blocks BLK1~BLKz. Each memory block includes a plurality of memory cells. Each memory block may be connected to the row decoder circuit 113 through at least one ground select line GSL, a plurality of word lines WL and at least one string select line SSL. Each memory block may be connected to the page buffer circuit 115 through a plurality of bit lines BL. The memory blocks BLK1~BLKz may be connected to a plurality of bit lines BL in common. Memory cells of the memory blocks BLK1~BLKz may have the same structure. Each of the memory blocks BLK1~BLKz may be an erase operation unit. Memory cells of the memory cell array 111 may be erased by a memory block unit. Memory cells that belong to one memory block may be erased at the same time. Each memory block may be divided into a plurality of sub blocks. Each sub block may be an erase operation unit.

The row decoder circuit 113 is connected to the memory cell array 111 through a plurality of ground select lines GSL, a plurality of word lines WL, and a plurality of string select lines SSL. The row decoder circuit 113 operates under the control of the control logic circuit 119. The row decoder circuit 113 can decode an address being received from a controller through an input/output channel and can control voltages being applied to the string select lines SSL, the word lines WL, and the ground select lines GSL according to the decoded address.

In a program operation, the row decoder circuit 113 may apply a program voltage VPGM to a selected word line of a memory block selected by an address and may apply a pass voltage VPASS to unselected word lines of the selected memory block. In a read operation, the row decoder circuit 113 may apply a select read voltage VRD to the selected word line of the memory block selected by the address and may apply an unselect read voltage VREAD to the unselected word lines of the selected memory block. In an erase operation, the row decoder circuit 113 may apply erase voltages (for example, a ground voltage or low voltages having levels similar to the ground voltage) to word lines of the memory block selected by the address.

The page buffer circuit 115 is connected to the memory cell array 111 through a plurality of bit lines BL. The page buffer circuit 115 is connected to the data input/output circuit 117 through a plurality of data lines DL. The page buffer circuit 115 operates under the control of the control logic circuit 119.

In a program operation, the page buffer circuit 115 can store data to be programmed in memory cells. The page buffer circuit 115 can apply voltages to the bit lines BL based on the stored data. For example, the page buffer circuit 115 can function as a write driver. In a read operation, the page buffer circuit 115 can sense voltages of the bit lines BL and can store a sensing result. For example, the page buffer circuit 115 can function as a sense amplifier.

The data input/output circuit 117 is connected to the page buffer circuit 115 through the data lines DL. The data input/output circuit 117 can output data read by the page buffer circuit 115 to the controller through the input/output channel and can transfer data being received from the controller through the input/output channel to the page buffer circuit 115.

The control logic circuit 119 can receive a command from the controller through the input/output channel and can receive a control signal from the controller through a control channel. The control logic circuit 119 can receive a command being received through the input/output channel in response to the control signal, can route an address being received through the input/output channel to the row decoder circuit 113, and can route an address being received through the input/output channel to the data input/output circuit 117. The control logic circuit 119 decodes the received command and can control the nonvolatile memory device 110 according to the decoded command.

In a read operation, the control logic circuit 119 can generate a data strobe signal DQS from a read enable signal (/RE) being received from the controller through the control channel. The generated data strobe signal DQS may be output to the controller through the control channel. In a write operation, the control logic circuit 119 can receive the data strobe signal DQS from the controller through the control channel.

The control logic circuit 119 includes a voltage control circuit VC. The voltage control circuit VC is configured to control a level of an erase voltage VERS being supplied to the memory cell array 111. For example, the voltage control circuit VC can control a level of the erase voltage VERS based on a pass signal P and a fail signal F being received from a pass/fail check circuit PF, or verification information VI indicating a result of erase verification.

The pass/fail check circuit PF is connected to the page buffer circuit 115. The pass/fail check circuit PF can receive data read from the memory cell array 111 in an erase verification operation from the page buffer circuit 115. Based on the received data, the pass/fail check circuit PF can distinguish an erase pass or an erase fail. If a result of erase verification is distinguished as an erase pass, the pass/fail check circuit PF can output the pass signal P to the control logic circuit 119. If a result of erase verification is distinguished as an erase fail, the pass/fail check circuit PF can output the fail signal F to the control logic circuit 119.

The pass/fail check circuit PF includes a counter CNT. The counter CNT can count the number of pass cells distinguished as an erase pass or the number of fail cells distinguished as an erase fail among data received from the page buffer circuit 115.

The pass/fail check circuit PF can output data received from the page buffer circuit 115, the number of pass bits, or the number of fail bits to the control logic circuit 119 as verification information VI.

FIG. 2 is a circuit diagram illustrating a memory block in accordance with some embodiments of the disclosure. Referring to FIG. 2, a memory block BLKa includes a plurality of cell strings (CS11~CS21, CS12~CS22). The cell strings (CS11~CS21, CS12~CS22) may be arranged along a row direction and a column direction to form rows and columns.

For example, the cell strings CS11 and CS12 arranged along the row direction may form a first row and the cell strings CS21 and CS22 arranged along the row direction may form a second row. The cell strings CS11 and CS21 arranged along the column direction may form a first column and the cell strings CS12 and CS22 arranged along the column direction may form a second column.

Each cell string may include a plurality of transistors. The cell transistors include ground select transistors GST, memory cells MC1~MC6, and string select transistors SSTa and SSTb. The ground select transistor GST, the memory cells MC1~MC6 and string select transistors SSTa and SSTb of each cell string may be laminated in a height direction perpendicular to a plane (e.g., a plane on a substrate of the memory block BLKa) on which the cell strings (CS11~CS21, CS12~CS22) are arranged along rows and columns.

The cell transistors may be charge trap type transistors having threshold voltages that vary depending on the amounts of charges trapped in an insulating layer.

Sources of the lowermost ground select transistors GST may be connected to a common source line CSL in common.

Control gates of the ground select transistors GST of the cell strings (CS11~CS21, CS12~CS22) may be connected to ground select lines GSL1 and GSL2. Ground select transistors of the same row may be connected to the same ground select line and ground select transistors of different rows may be connected to different ground select lines. For example, ground select transistors GST of the cell strings CS11 and CS12 of the first row may be connected to a first ground select line GSL1 and ground select transistors GST of the cell strings CS21 and CS22 of the second row may be connected to a second ground select line GSL2.

Control gates of memory cells located at the same height (or order) from a substrate (or ground select transistors GST) may be connected to one word line in common, and control gates of memory cells located at different heights (or orders) from the substrate (or ground select transistors GST) may be connected to different word lines WL1~WL6 respectively. For example, the memory cells MC1 are connected to the word line WL1 in common. The memory cells MC2 are connected to the word line WL2 in common. The memory cells MC3 are connected to the word line WL3 in common. The memory cells MC4 are connected to the word line WL4 in common. The memory cells MC5 are connected to the word line WL5 in common. The memory cells MC6 are connected to the word line WL6 in common.

At first string select transistors SSTa of the same height (or order) of the cell strings (CS11~CS21, CS12~CS22), control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At second string select transistors SSTb of the same height (or order) of the cell strings (CS11~CS21, CS12~CS22), control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or orders) of cell strings of the same row are connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings (CS11~CS21, CS12~CS22) are connected to different bit lines BL1 and BL2 respectively. For example, the string select transistors SSTb of the cell strings CS11~CS21 of the first column are connected to the bit line BL1 in common. The string select transistors SSTb of the cell strings CS12~CS22 of the second column are connected to the bit line BL2 in common.

The cell strings CS11 and CS12 may form a first plane. The cell strings CS21 and CS22 may form a second plane.

In a memory block BLKa, memory cells of each height of each plane may form a physical page. The physical page may be a write unit and a read unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected. In the selected plane, one row of the memory cells MC may be selected by the word lines WL1~WL6. In the selected row, a select voltage may be applied to the second word line WL2 and an unselect voltage may be applied to the remaining word lines WL1 and WL3~WL6. That is, a physical page corresponding to the second word line WL2 of the second plane may be selected by controlling voltages of the string select lines SSL1a, SSL1b, SSL2a and SSL2b and the word lines WL1~WL6. In the memory cells MC2 of the selected physical page, a write or read operation may be performed.

In the memory block BLKa, an erase of the memory cells MC1~MC6 may be performed by a memory block unit or a sub block unit. When an erase operation is performed by a memory block unit, all the memory cells MC of the memory block BLKa may be erased at the same time according to an erase request (e.g., an erase request from an external memory controller). When an erase operation is performed by a sub block unit, a part of the memory cells MC1~MC6 of the memory block BLKa may be erased at the same time according to an erase request and the remaining memory cells may be erase-prohibited. A low voltage (for example, a ground voltage or a voltage having a level similar to the ground voltage) may be supplied to a word line connected to memory cells MC being erased and a word line connected to erase-prohibited memory cells MC may be floated.

The memory block BLKa illustrated in FIG. 2 is illustrative. A technical spirit of the disclosure is not limited to the memory block BLKa illustrated in FIG. 2. For example, the number of rows of cell strings may increase or decrease. As the number of rows of cell strings changes, the number of string select lines or ground select lines connected to rows of the cell strings, and the number of cell strings connected to one bit line may also be changed.

The number of columns of cell strings may increase or decrease. As the number of columns of cell strings changes, the number of bit lines connected to columns of the cell strings, and the number of cell strings connected to one string select line may also be changed.

A height of the cell strings may increase or decrease. For example, the number of ground select transistors, memory cells or string select transistors that are laminated on each cell string may increase or decrease.

Memory cells MC that belong to one physical page may correspond to at least three logical pages. For example, k (k is a positive integer greater than 2) number of bits may be programmed in one memory cell MC. In the memory cells MC that belong to one physical page, k number of bits being programmed in each memory cell MC may form k number of logical pages respectively.

In an embodiment of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
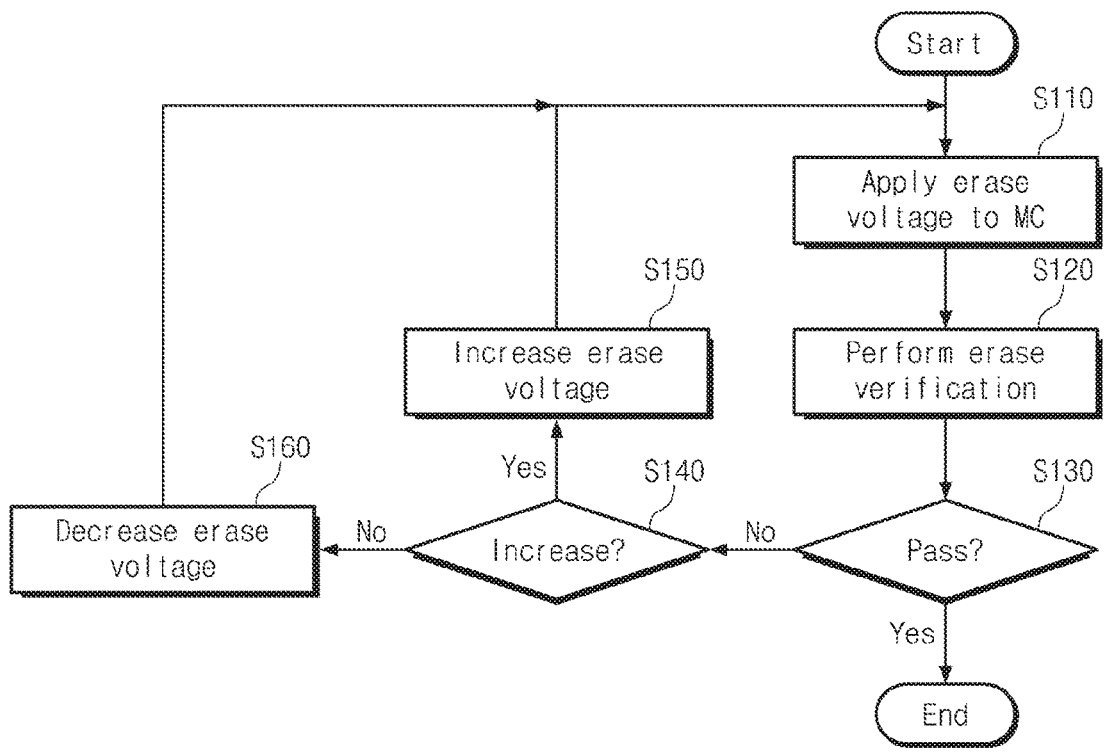
FIG. 3 is a flowchart illustrating an operation method of a nonvolatile memory device in accordance with a first embodiment of the disclosure.

FIG. 3 is a flowchart illustrating an operation method of a nonvolatile memory device in accordance with a first embodiment of the disclosure. A method in which the nonvolatile memory device 110 performs an erase operation with respect to a selected erase unit (e.g., memory block or sub block) is illustrated in FIG. 3.

Referring to FIGS. 1 through 3, an erase operation includes repeatedly performing an erase loop including an erase and erase verification. Steps S110 through S160 of FIG. 3 shows one erase loop. The step S110 corresponds to an erase of each erase loop. The steps S120 and S130 correspond to erase verification of each erase loop. The steps S140 through S160 correspond to a control of an erase voltage VERS.

In the step S110, the control logic circuit 119 applies an erase voltage VERS to memory cells MC of a selected erase unit. For example, the erase voltage VERS may be a positive high voltage. The erase voltage VERS may be applied to bodies of the memory cells MC of the selected erase unit.

In the step S120, the control logic circuit 119 can control the row decoder circuit 113 and the page buffer circuit 115 to perform erase verification on memory cells MC to which the erase voltage VERS is applied.

For example, the erase verification may be concurrently or sequentially performed. In the case that the erase verification is performed at the same time, the row decoder circuit 113 can apply erase verification voltages VER to all the word lines WL of the selected erase unit. The erase verification voltages VER may be a ground voltage or low voltages having a similar level to the ground voltage. The row decoder circuit 113 can apply turn-on voltages to string select lines SSL and ground select lines GSL corresponding to the selected erase unit. The turn-on voltages may have levels that can turn on transistors or memory cells to which the turn-on voltages are applied.

The page buffer circuit 115 can float bit lines BL after precharging the bit lines BL to a power supply voltage or positive voltages. The page buffer circuit 115, after a develop time passes, can read data from memory cells MC which are targets of the erase verification by latching voltages of the bit lines BL. Data read from the page buffer circuit 115 is transmitted to the pass/fail check circuit PF.

In the case that the erase verification is sequentially performed, the selected erase unit may be divided into two or more erase verification units. The erase verification may be performed while sequentially selecting two or more erase verification units. The row decoder circuit 113 can apply the erase verification voltages VER to a word line or word lines corresponding to the selected erase verification unit. The row decoder circuit 113 may also apply turn-on voltages to a string select line or string select lines and a ground select line or ground select lines corresponding to the selected erase verification unit.

The page buffer circuit 115 can float bit lines BL after precharging the bit lines BL to a power supply voltage or positive voltages. The page buffer circuit 115, after a develop time passes, can read data from memory cells MC which are a target of the erase verification by latching voltages of the bit lines BL. Data read from the page buffer circuit 115 is transmitted to the pass/fail check circuit PF.

While the erase verification is performed sequentially with respect to erase verification units, the page buffer circuit 115 can output data read from the erase verification units to the pass/fail check circuit PF as many as the number of times corresponding to the number of the erase verification units.

In the step S130, the control logic circuit 119 can control the pass/fail check circuit PF to perform a pass/fail check using data read by the page buffer circuit 115.

In the case that a bit transmitted to the pass/fail check circuit PF is '1', it may be distinguished that at least one memory cell or memory cells relevant to the transmitted bit is an erase fail. In the case that a bit transmitted to the pass/fail check circuit PF is '0', it may be distinguished that at least one memory cell or memory cells relevant to the transmitted bit is an erase pass.

In the case that while the erase verification is concurrently or sequentially performed, '1' does not exist in data transmitted from the page buffer circuit 115 or the number of '1's belongs to (or under) a correctable error range, the pass/fail check circuit PF can distinguish that an erase of the selected erase unit is passed. In the case that while the erase verification is concurrently or sequentially performed, '1' exists in data transmitted from the page buffer circuit 115 or the number of '1's does not belong to (or under) the correctable error range, the pass/fail check circuit PF can distinguish that an erase of the selected erase unit is failed.

In the case that it is distinguished that an erase of the selected erase unit is failed, a counter CNT can count the number of '1's indicating an erase fail or the number of '0's indicating an erase pass among bits during the erase verification which is concurrent or sequential. A count value may be transmitted to the control logic circuit 119 as verification information VI.

In the step S140, the control logic circuit 119 can determine a control method of controlling the erase voltage VERS. For example, the control logic circuit 119 can select one of an increase and a decrease of the erase voltage VERS.

In the case that the control logic circuit 119 selects an increase of the erase voltage VERS, in the step S150, the voltage control circuit VC increases a level of the erase voltage VERS. In the case that the control logic circuit 119 selects a decrease of the erase voltage VERS, in the step S160, the voltage control circuit VC decreases a level of the erase voltage VERS. After that, the step S110 is performed again.

The control logic circuit 119 can control a level of the erase voltage VERS of a next erase loop based on verification information VI of a current erase loop. For example, according to the verification information VI of the current erase loop, the control logic circuit 119 can increase or decrease an erase voltage VERS of a next erase loop compared with the erase voltage VERS of the current erase loop.

Figure 4:
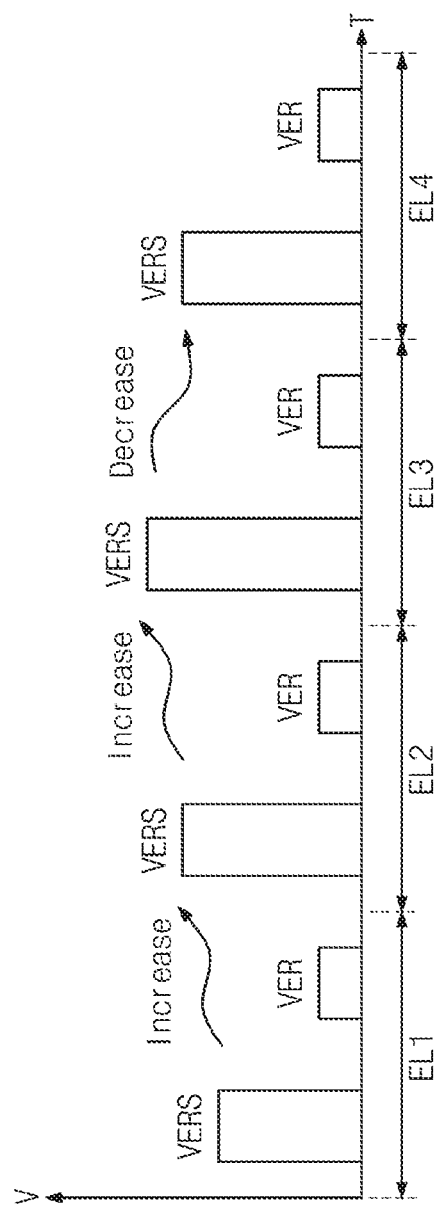
FIG. 4 is a timing diagram illustrating a process in which an erase loop is repeated in an erase unit selected according to an erase operation method illustrated in FIG. 3.

FIG. 4 is a timing diagram illustrating a process in which an erase loop is repeated in an erase unit selected according to an erase operation method illustrated in FIG. 3. In FIG. 4, a horizontal axis indicates time (T) and a vertical axis indicates a voltage (V) being applied to memory cells MC of a selected erase unit.

For brevity of description, in FIG. 4, in each erase loop EL, other voltages are omitted except that of an erase voltage VERS being applied to bodies of memory cells MC of an erase unit and an erase verification voltage VER being applied to word lines WL connected to memory cells MC of an erase unit.

Referring to FIGS. 1 and 4, in a first erase loop EL1, the erase voltage VERS and the erase verification voltage VER are applied to memory cells MC of the selected erase unit. For example, in the first erase loop EL1, an increase of the erase voltage VERS may be selected.

In a second erase loop EL2, the erase voltage VERS and the erase verification voltage VER are applied to memory cells MC of the selected erase unit. A level of the erase voltage VERS of the second erase loop EL2 may be higher than a level of the erase voltage VERS of the first erase loop EL1. For example, in the second erase loop EL2, an increase of the erase voltage VERS may be selected.

In a third erase loop EL3, the erase voltage VERS and the erase verification voltage VER are applied to memory cells MC of the selected erase unit. A level of the erase voltage VERS of the third erase loop EL3 may be higher than the level of the erase voltage VERS of the second erase loop EL2. For example, in the third erase loop EL3, a decrease of the erase voltage VERS may be selected.

In a fourth erase loop EL4, the erase voltage VERS and the erase verification voltage VER are applied to memory cells MC of the selected erase unit. A level of the erase voltage VERS of the fourth erase loop EL4 may be lower than the level of the erase voltage VERS of the third erase loop EL3.

As described above, the control logic circuit 119 can increase the erase voltage VERS in early erase loops of an erase operation. The control logic circuit 119 can decrease the erase voltage VERS in late erase loops.

Figure 5:
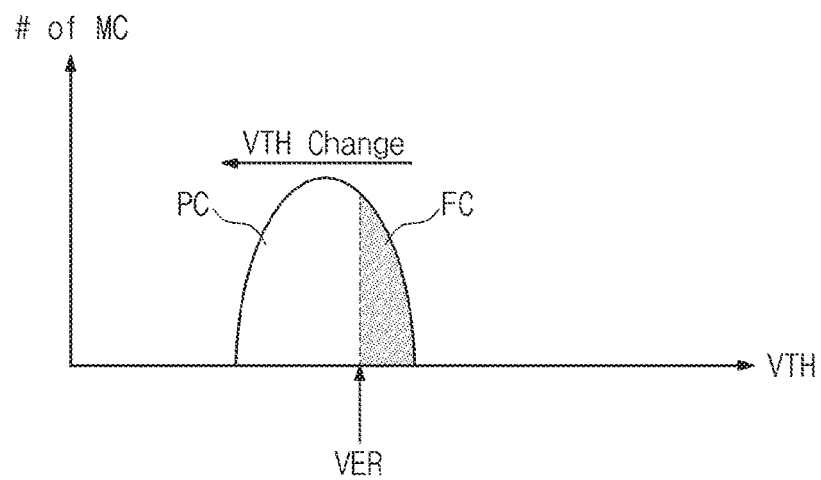
FIG. 5 is a graph illustrating a process in which as an erase operation is performed and threshold voltages of memory cells are changed.

FIG. 5 is a graph illustrating a process in which as an erase operation is performed, threshold voltages of memory cells are changed. In FIG. 5, a horizontal axis indicates threshold voltages VTH of memory cells MC and a vertical axis indicates the number of memory cells MC. That is, in FIG. 5, a distribution of threshold voltages of the memory cells MC is illustrated in FIG. 5.

Referring to FIGS. 1 and 5, as an erase loop is repeated, threshold voltages of the memory cells MC are lowered. Pass cells PC having threshold voltages lower than the erase verification voltage VER are read as '0' and are distinguished to be passed. Fail cells FC having threshold voltages higher than the erase verification voltage VER are read as '1' and are distinguished to be failed.

In a usual erase operation, if fail cells FC exist (or the number of fail cells FC is beyond an error allowable range), a level of the erase voltage VERS increases every time an erase loop is repeated. In this case, in fail cells FC having threshold voltages of similar level to the erase verification voltage VER, as a level of the erase voltage VERS increases, a deep erase may occur. If a deep erase occurs, a strong stress is applied to the memory cells MC and memory cells may be deteriorated.

The nonvolatile memory device 110 can prevent the memory cells MC from being deep erased by increasing the erase voltage VERS in the early erase loops EL of an erase operation and decreasing the erase voltage VERS in the late erase loops EL of the erase operation.

Figure 6:
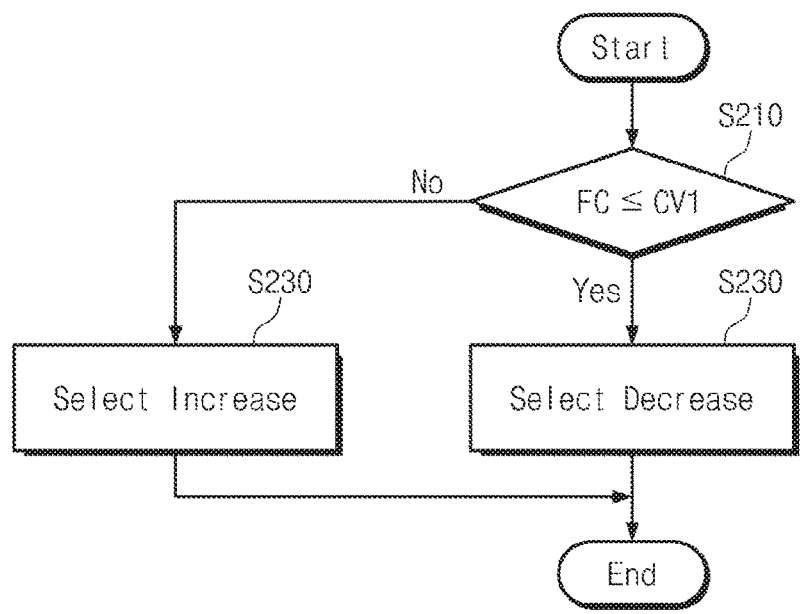
FIG. 6 illustrates an example of determining a method of controlling an erase voltage in an erase operation of FIG. 3.

FIG. 6 illustrates an example of determining a method of controlling an erase voltage in an erase operation of FIG. 3. Referring to FIGS. 1 and 6, the control logic circuit 119 can receive the number of fail cells FC from the pass/fail check circuit PF as verification information VI.

In a step S210, the control logic 119 distinguishes whether the number of fail cells FC is less than a first critical value CV1. If the number of fail cells FC is smaller than the first critical value CV1, in a step S220, the control logic 119 may select a decrease as a control method of the erase voltage VERS. If the number of fail cells FC is greater than the first critical value CV1, the control logic 119 may select, in a step S230, an increase as a control method of the erase voltage VERS.

For example, in an erase verification operation, the first critical value CV1 may be determined as a ratio with respect to the number of bits of data read by the page buffer circuit 115. For example, in an erase verification operation, the first critical value CV1 may be one-third of the number of bits of data read by the page buffer circuit 115.

FIG. 7 illustrates a change of a threshold voltage distribution of memory cells being erased according to some embodiments of the disclosure. In FIG. 7, a horizontal axis indicates threshold voltages of memory cells MC and a vertical axis indicates the number of memory cells MC. Referring to FIGS. 1, 6 and 7, at a first time (T1), the number of fail cells FC may reach the first critical value CV1. Thus, in an erase loop after the first time (T1), a level of the erase voltage VERS may be reduced.

For example, in a K erase loop of the first time (T1), a decrease of the erase voltage VERS may be determined. After that, a level of the erase voltage VERS being applied in a K+1 erase loop may be lower than a level of the erase voltage VERS of the K erase loop. After that, as an erase loop is repeated, a level of the erase voltage VERS may gradually decrease.

As another example, in the K erase loop of the first time (T1), a decrease of the erase voltage VERS may be determined. After that, a level of the erase voltage VERS being applied in a K+1 erase loop may be lower than a level of the erase voltage VERS of the K erase loop. After that, as an erase loop is repeated, a level of the erase voltage VERS of the K+1 erase loop may be maintained.

That is, as an erase loop is repeated after a decrease of the erase voltage VERS is decided, a level of the erase voltage VERS may continuously decrease or may maintain a specific value after it is decreased by the predetermined number of times.

At a second time (T2), an erase operation is finished. Since a level of the erase voltage VERS decreases at the first time (T1), the amount of change in threshold voltages of fail cells FC decreases every time an erase loop is repeated after the first time (T1). The amount of change in threshold voltages of pass cells PC becomes smaller than the amount of change in threshold voltages of fail cells FC. Thus, like a graph of a second time (T2), a distribution width of threshold voltages of memory cells MC is reduced and it is prevented that the memory cells MC are over erased.

In the embodiments described above, it was described that the control method of the erase voltage VERS is decided according to the number of fail cells FC. However, the control method of the erase voltage VERS may be decided according to the number of times an erase loop is performed. For example, if during one erase operation, the number of times an erase loop is performed is smaller than a critical value, an increase of the erase voltage VERS may be selected. If during one erase operation, the number of times an erase loop is performed is greater than the critical value, a decrease of the erase voltage VERS may be selected.

Figure 8:
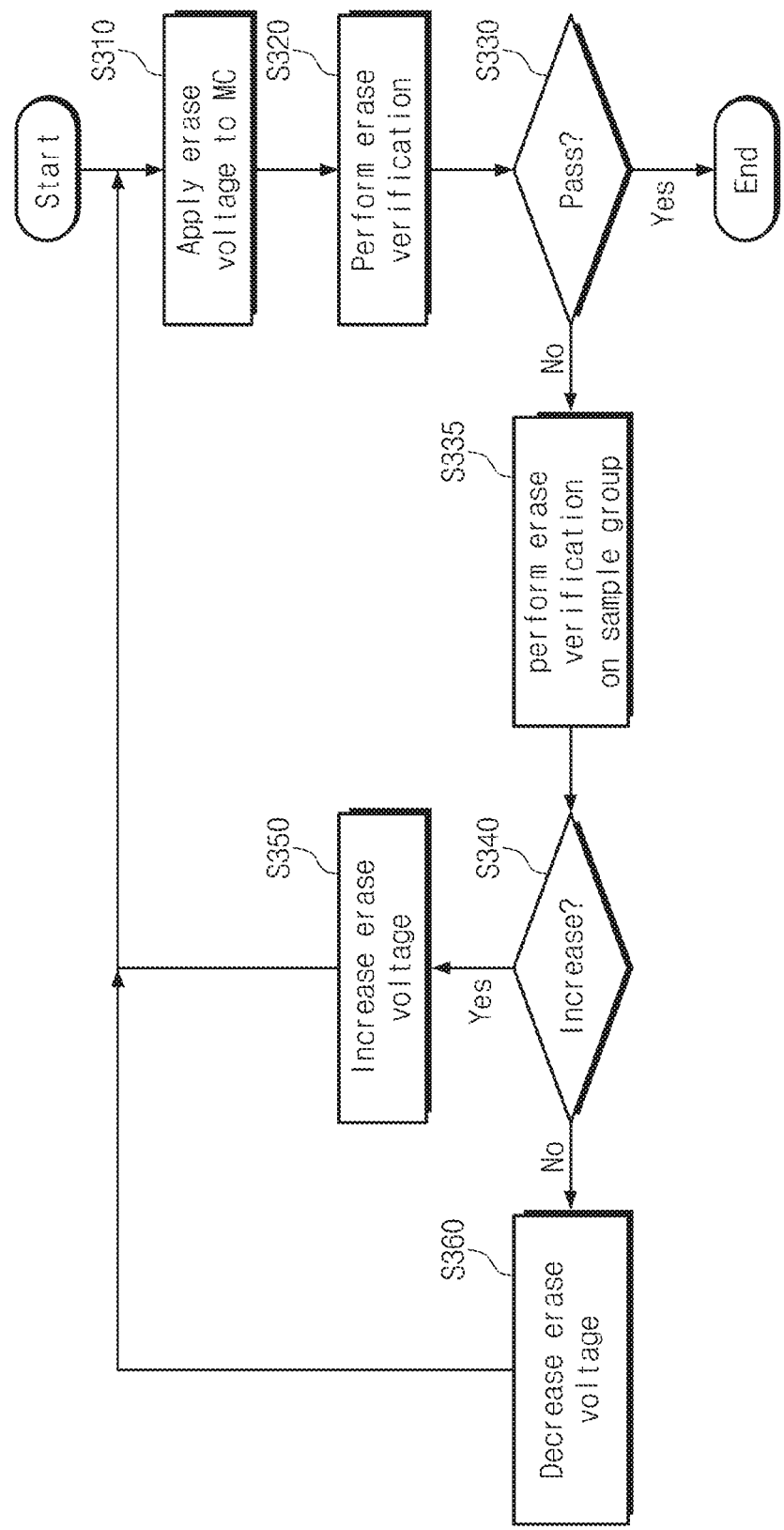
FIG. 8 is a flowchart illustrating an operation method of a nonvolatile memory device in accordance with a second embodiment of the disclosure.

FIG. 8 is a flowchart illustrating an operation method of a nonvolatile memory device in accordance with a second embodiment of the disclosure. Referring to FIGS. 1, 3 and 8, steps S310 through S330 are the same with the steps S110 through S130 of FIG. 3 and steps S340 through S360 are the same with the steps S140 through S160 of FIG. 3.

As compared with the operation method of FIG. 3, in a step S335, the control logic circuit 119 controls so that an erase verification operation is performed on a sample group among memory cells MC of selected erase unit. Verification information VI may be generated according to an erase verification result with respect to the sample group.

In the case that an erase verification result with respect to an erase unit is an erase fail, the nonvolatile memory device 110 performs erase verification on the sample group that belongs to the erase unit and may determine a control method of the erase voltage VERS according to an erase verification result of the sample group.

Figure 9:
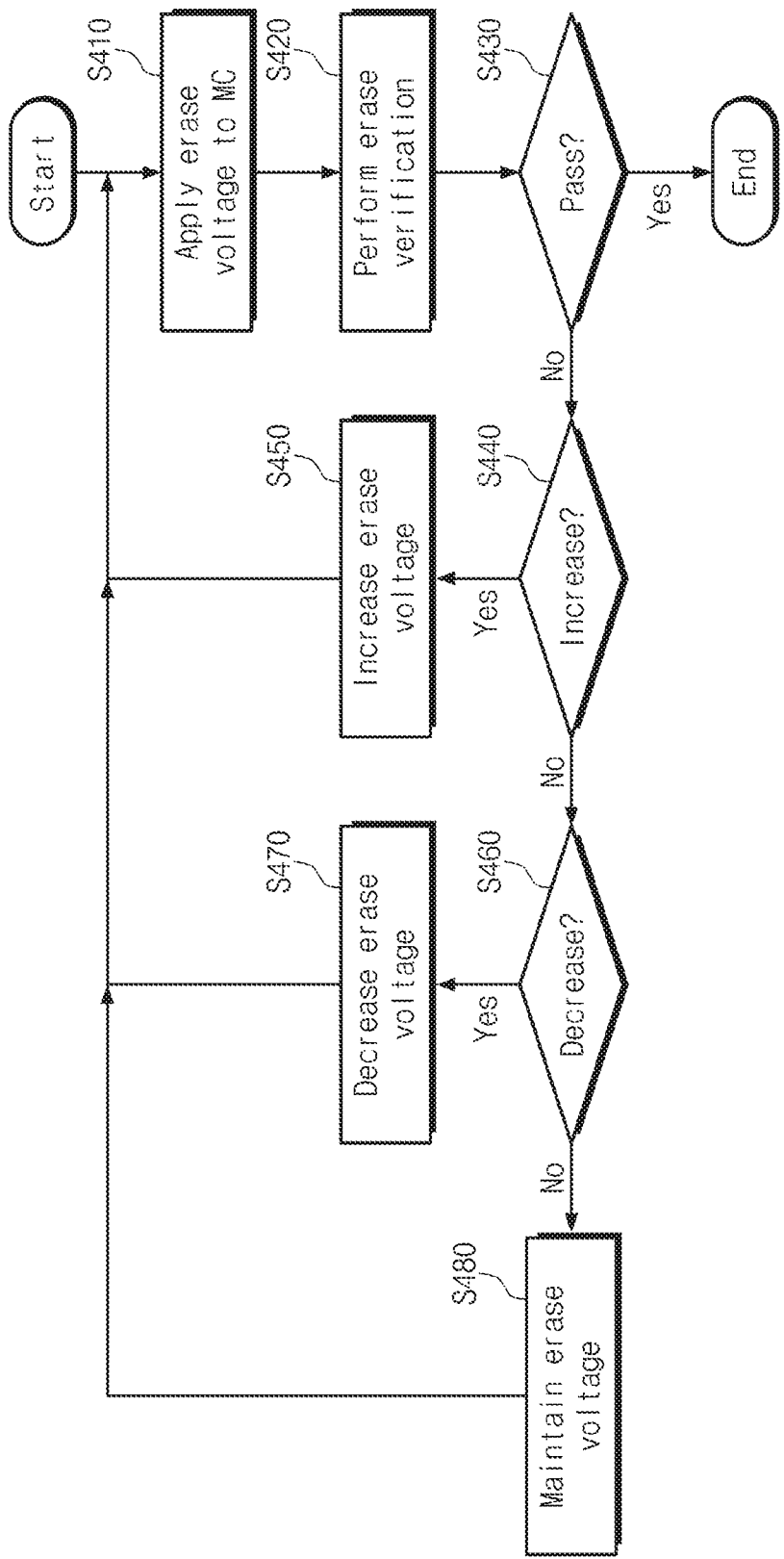
FIG. 9 is a flowchart illustrating an operation method of a nonvolatile memory device in accordance with a third embodiment of the disclosure.

FIG. 9 is a flowchart illustrating an operation method of a nonvolatile memory device in accordance with a third embodiment of the disclosure. Referring to FIGS. 1, 3 and 9, steps S410 through S430 are the same with the steps S110 through S130 of FIG. 3.

In the steps S440 through S480, the control logic circuit 119 determines a control method of the erase voltage VERS.

For example, it is determined whether to increase the erase voltage VERS (step S440). If an increase of the erase voltage VERS is determined, a next erase loop is performed after the erase voltage VERS increases (step S450).

If it is determined that the erase voltage VERS does not increase, it is determined whether the erase voltage VERS is reduced (step S460). If a decrease of the erase voltage VERS is selected, a next erase loop is performed after the erase voltage VERS decreases (step S470).

If it is determined that the erase voltage VERS does not decrease, the erase voltage VERS is maintained (S480) and then a next erase loop is performed. As compared with the operation method of FIG. 3, the control logic circuit 119 may select one of an increase, a decrease and maintenance of the erase voltage VERS as a control method of the erase voltage VERS.

Figure 10:
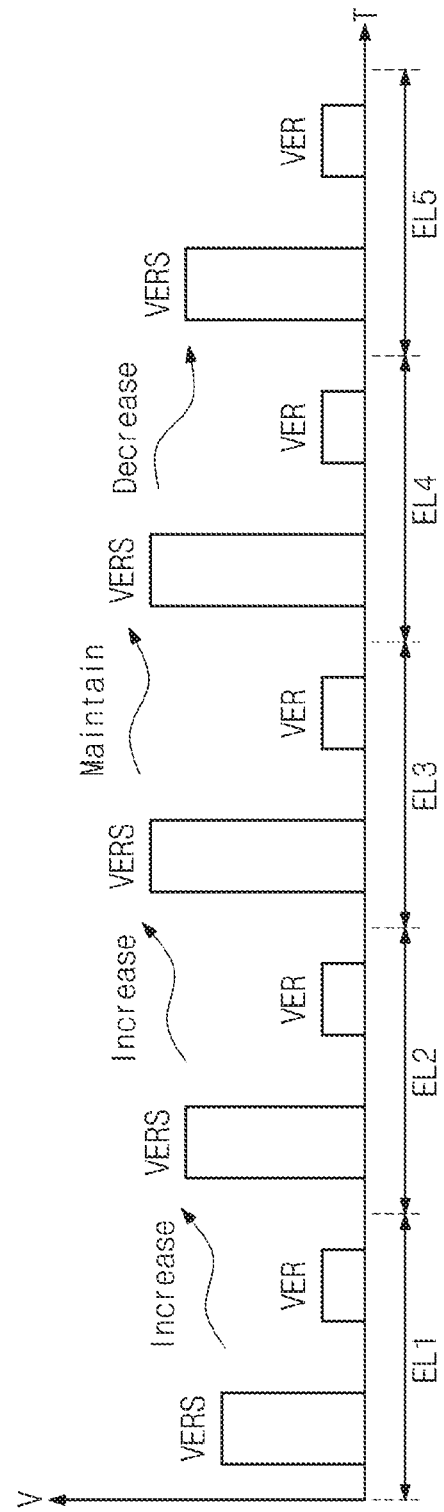
FIG. 10 is a timing diagram illustrating a process in which an erase loop is repeated in an erase unit selected according to an erase operation method illustrated in FIG. 9.

FIG. 10 is a timing diagram illustrating a process in which an erase loop is repeated in an erase unit selected according to an erase operation method illustrated in FIG. 9. In FIG. 10, a horizontal axis indicates time (T) and a vertical axis indicates a voltage (V) being applied to memory cells MC of a selected erase unit.

For brevity of description, in FIG. 10, other voltages are omitted except that the erase voltage VERS is applied to bodies of the memory cells MC of the erase unit in each erase loop EL and the erase verification voltage VER is applied to word lines WL connected to the memory cells MC of the erase unit.

Referring to FIGS. 1, 9 and 10, an increase of the erase voltage VERS may be selected in a first erase loop ELL. An increase of the erase voltage VERS may be selected in a second erase loop EL2. Maintenance of the erase voltage VERS may be selected in a third erase loop ELL A decrease of the erase voltage VERS may be selected in a fourth erase loop EL4.

As described above, the nonvolatile memory device 110 may increase the erase voltage VERS in early erase loops EL, may maintain the erase voltage VERS in a middle erase loop and may decrease the erase voltage VERS in a late erase loop EL.

For example, in a K erase loop of the first time (T1), a decrease of the erase voltage VERS may be determined. After that, a level of the erase voltage VERS being applied in a K+1 erase loop may be lower than a level of the erase voltage VERS of the K erase loop. After that, as an erase loop is repeated, a level of the erase voltage VERS may gradually decrease.

As another example, in the K erase loop of the first time (T1), a decrease of the erase voltage VERS may be determined. After that, a level of the erase voltage VERS being applied in a K+1 erase loop may be lower than a level of the erase voltage VERS of the K erase loop. After that, when an erase loop is repeated, a level of the erase voltage VERS may be maintained.

That is, as an erase loop is repeated after a decrease of the erase voltage VERS is decided, a level of the erase voltage VERS may continuously decrease or may maintain a specific value after it is decreased by the predetermined number of times.

Figure 11:
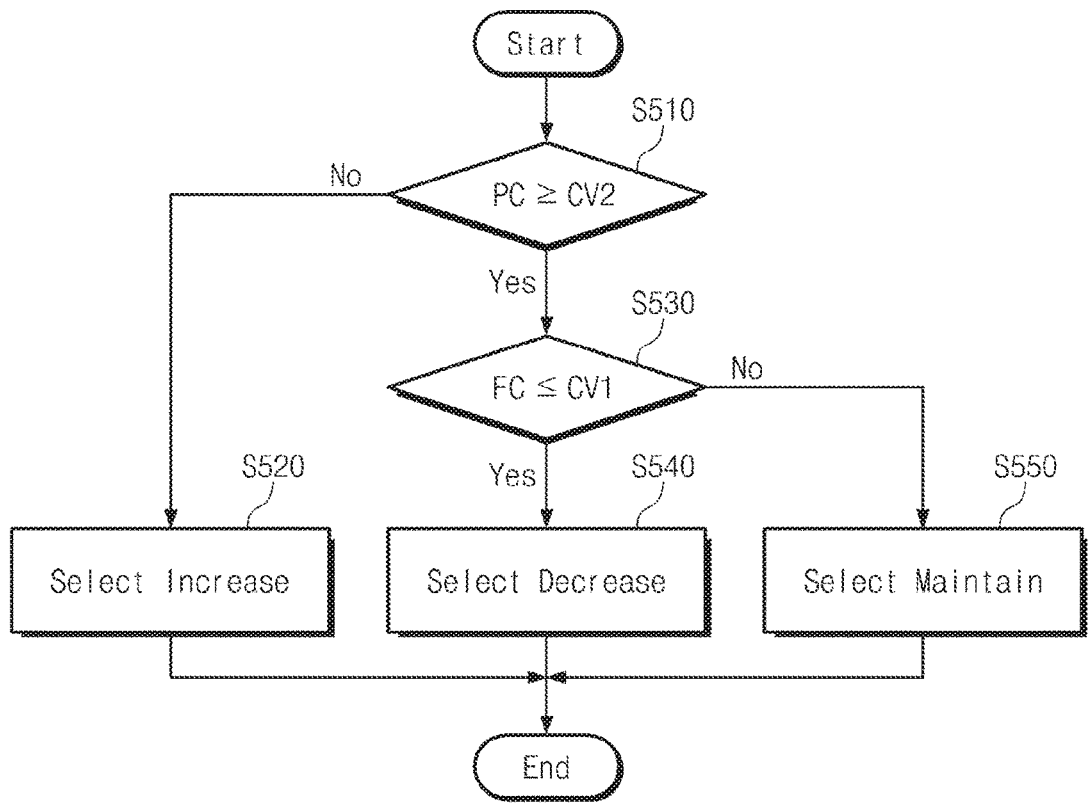
FIG. 11 illustrates an example of determining a method of controlling an erase voltage in an erase operation of FIG. 9.

FIG. 11 illustrates an example of determining a method of controlling an erase voltage in an erase operation of FIG. 9. Referring to FIGS. 1 and 11, the control logic circuit 119 may receive the number of pass cells PC and the number of fail cells FS from the pass/fail check circuit PF as verification information VI.

In a step S510, the control logic circuit 119 distinguishes whether the number of pass cells PC is greater than a second critical value CV2. If the number of pass cells PC is greater than the second critical value CV2, a step S530 is performed. If the number of pass cells PC is smaller than the second critical value CV2, in a step S520, the control logic circuit may select an increase as a control method of the erase voltage VERS. An increase of the erase voltage VERS is selected.

In the step S530, the control logic circuit 119 distinguishes whether the number of fail cells FC is smaller than the first critical value CV1. If the number of fail cells FC is smaller than the first critical value CV1, in a step S540, the control logic circuit may select a decrease as a control method of the erase voltage VERS. If the number of fail cells FC is greater than the first critical value CV1, in a step S550, the control logic circuit may select maintenance as a control method of the erase voltage VERS.

For example, in an erase verification operation, each of the first critical value CV1 and the second critical value CV2 may be determined as a ratio with respect to the number of bits of data read by the page buffer circuit 115. For example, in an erase verification operation, each of the first critical value CV1 and the second critical value CV2 may be one-third of the number of bits of data read by the page buffer circuit 115.

In the embodiments described above, it was described that the control method of the erase voltage VERS is decided according to the number of fail cells MC. However, the control method of the erase voltage VERS may be decided according to the number of times an erase loop is performed. For example, if during one erase operation, the number of times an erase loop is performed is smaller than a critical value, an increase of the erase voltage VERS may be selected. If during one erase operation, the number of times an erase loop is performed is greater than the critical value, a decrease of the erase voltage VERS may be selected.

As described with reference to FIG. 8, in the operation method of FIG. 9, the control method of the erase voltage VERS may be determined based on the verification information VI of the sample group.

Figure 12:
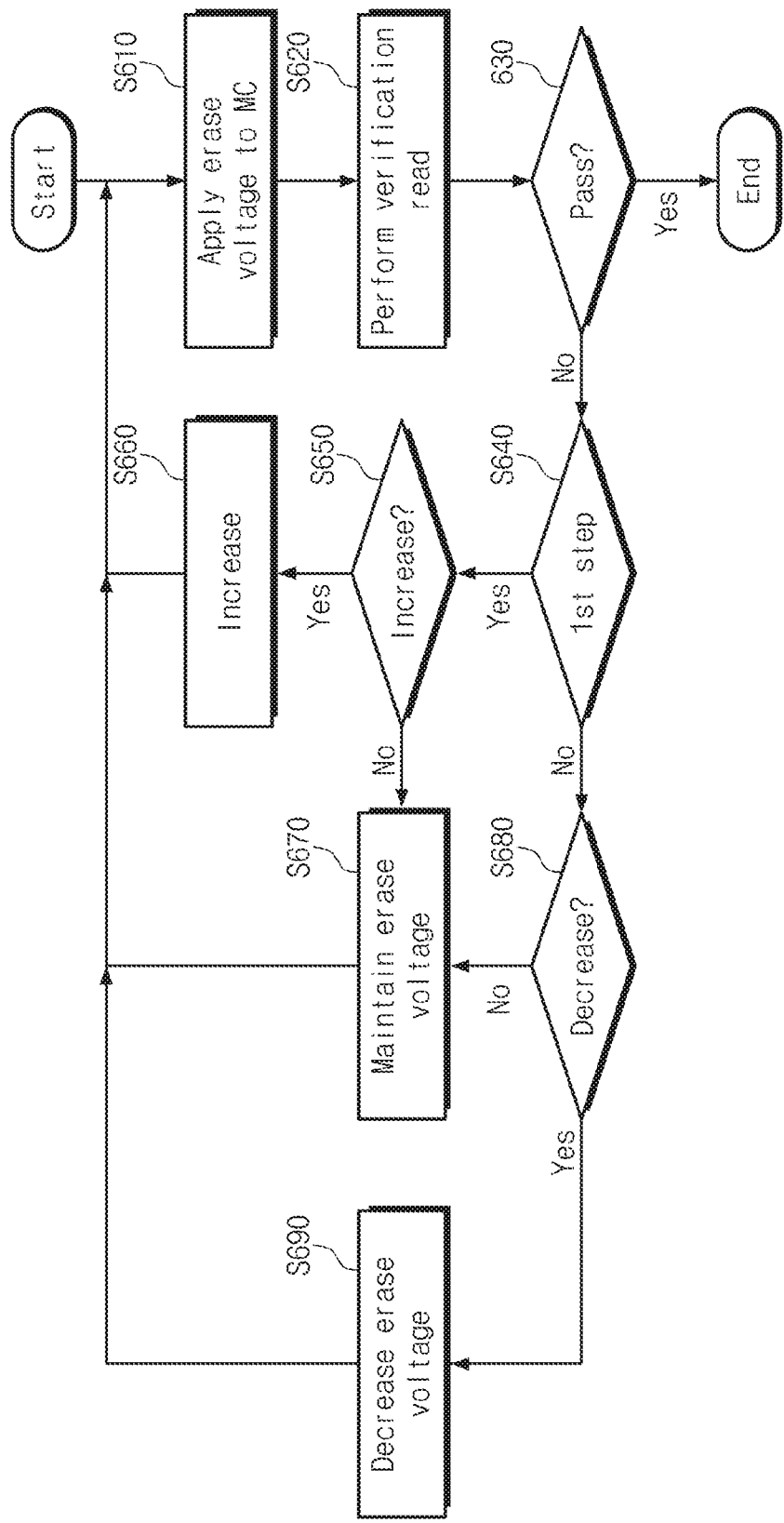
FIG. 12 is a flowchart illustrating an operation method of a nonvolatile memory device in accordance with a fourth embodiment of the disclosure.

FIG. 12 is a flowchart illustrating an operation method of a nonvolatile memory device in accordance with a fourth embodiment of the disclosure. Referring to FIGS. 1, 3 and 9, steps S610 through S630 are the same with the steps S410 through S430 of FIG. 9.

In a step S640, it is distinguished whether an erase operation is a first step. For example, if an erase operation begins, an erase operation may be set as the first step. If the erase operation is the first step, in a step S650, a control method of the erase voltage VERS is selected between an increase and maintenance. For example, the pass/fail check circuit PF may output the number of pass cells PC as verification information VI and may not output the number of fail cells FC as the verification information VI. The control logic circuit 119 may distinguish one increase and maintenance of the erase voltage VERS based on the verification information VI. If an increase of the erase voltage VERS is selected, in a step S660, the erase voltage VERS increases, and then a next loop is performed. If maintenance of the erase voltage VERS is selected, in a step S670, the erase voltage VERS is maintained, and then a next loop is performed.

If the erase voltage VERS is maintained at least once, the erase operation may be set as a second step. In the step S640, if the erase operation is distinguished as the second step, a step S680 is performed. In the step S680, a control method of the erase voltage VERS is selected between one of decrease and maintenance. For example, the pass/fail check circuit PF may output the number of fail cells FC as verification information VI and may not output the number of pass cells PC as the verification information VI. The control logic circuit 119 may distinguish one of decrease and maintenance of the erase voltage VERS based on the verification information VI. If the maintenance of the erase voltage VERS is selected, in a step S670, the erase voltage VERS is maintained, and then a next loop is performed. If a decrease of the erase voltage VERS is selected, in a step S690, the erase voltage VERS decreases, and then a next loop is performed.

For example, in a K erase loop of the first time (T1), a decrease of the erase voltage VERS may be determined. After that, a level of the erase voltage VERS being applied in a K+1 erase loop may be lower than a level of the erase voltage VERS of the K erase loop. After that, as an erase loop is repeated, a level of the erase voltage VERS may gradually decrease.

As another example, in the K erase loop of the first time (T1), a decrease of the erase voltage VERS may be determined. After that, a level of the erase voltage VERS being applied in a K+1 erase loop may be lower than a level of the erase voltage VERS of the K erase loop. After that, when an erase loop is repeated, a level of the erase voltage VERS may be maintained.

That is, as an erase loop is repeated after a decrease of the erase voltage VERS is decided, a level of the erase voltage VERS may continuously decrease or may maintain the value after it is decreased by the predetermined number of times.

For example, in the case that the erase voltage VERS is decreased and then maintains the value decreased, the erase operation may be set as a third step. In the third step, the pass/fail check circuit PF may not output verification information VI. The control logic circuit 119 may not distinguish a control method of the erase voltage VERS.

In the embodiments described above, it was described that the control method of the erase voltage VERS is decided according to the number of pass cells PC. However, the control method of the erase voltage VERS may be decided according to the number of times an erase loop is performed. For example, if during one erase operation, the number of times an erase loop is performed is smaller than the first critical value, an increase of the erase voltage VERS may be selected. If during one erase operation, the number of times an erase loop is performed is greater than the first critical value and smaller than the second critical value, maintenance of the erase voltage VERS may be selected. If during one erase operation, the number of times an erase loop is performed is greater than the second critical value, a decrease of the erase voltage VERS may be selected.

As described with reference to FIG. 8, in the operation method of FIG. 12, the control method of the erase voltage VERS may be determined based on the verification information VI of the sample group.

Figure 13:
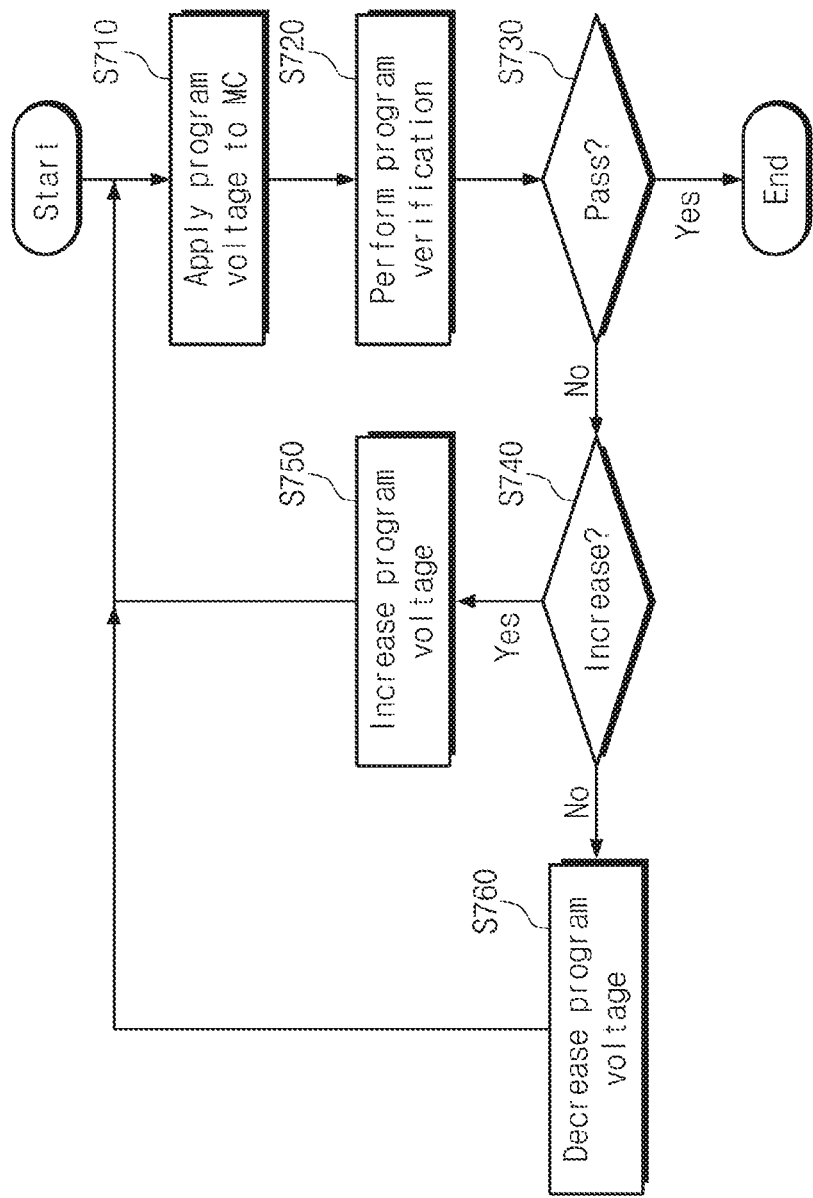
FIG. 13 is a flowchart illustrating an operation method of a nonvolatile memory device in accordance with a fifth embodiment of the disclosure.

FIG. 13 is a flowchart illustrating an operation method of a nonvolatile memory device in accordance with a fifth embodiment of the disclosure. A method in which the nonvolatile memory device 110 performs a program operation with respect to a selected program unit (e.g., a physical page or a logical page) is illustrated in FIG. 13.

The program operation includes repeatedly performing a program loop including a program and program verification. Steps S710 through S760 of FIG. 13 illustrate one program loop. The step S710 corresponds to a program of each program loop. The steps S720 and S730 correspond to program verification of each program loop. The steps S740 through S760 correspond to a control of the program voltage VERS.

Referring to FIGS. 1, 3 and 13, in the step S710, the control logic circuit 119 may control the row decoder circuit 113 and the page buffer circuit 115 so that a program operation is performed on memory cells MC of a selected program unit.

For example, the row decoder circuit 113 may apply a program voltage VPGM to a word line WL connected to memory cells MC of the selected program unit and may apply pass voltages VPASS to word lines WL connected to memory cells MC of an unselected program unit. The pass voltages VPASS may be a positive high voltage that turns on the memory cells MC. The program voltage VPGM may be a positive high voltage higher than the pass voltages VPASS.

The page buffer circuit 115 may apply voltages to bit lines BL according to data loaded through the data input/output circuit 117.

In the step S720, the control logic circuit 119 may control the row decoder circuit 113 and the page buffer circuit 115 so that the program verification operation is performed on the memory cells MC to which the program voltage VPGM is applied.

The program verification operation may be sequentially performed. In a program operation, each memory cell of the selected program unit is programmed to have one of an erase state and program states. The program verification operation may be sequentially performed by as much as the number of program states. For example, a program state of one of the program states may be selected. The row decoder circuit 113 may apply the program verification voltage VER to a word line WL connected to the memory cells of the selected program unit. The row decoder circuit 113 may apply turn-on voltages to unselected word lines in a memory block to which the selected program unit belongs. The turn-on voltages may have a level that turns on transistors or memory cells to which the turn-on voltage is applied. A level of the program verification voltage VER may be selected depending on selected program states. The row decoder circuit 113 may apply turn-on voltages to a string select line and a ground select line corresponding to the selected program unit.

The page buffer circuit 115 can float the bit lines BL after precharging bit lines BL to a power supply voltage or positive voltages. The page buffer circuit 115 can read data from memory cells MC which are targets of the program verification by latching voltages of the bit lines BL after a develop time passes.

While the program verification is sequentially performed with respect to program states, the page buffer circuit 115 can output data read from memory cells of a selected program unit to the pass/fail check circuit PF as much as the number of times corresponding to the program states.

The program verification may be performed with respect to some program states selected from among the program states.

In the step S730, the control logic circuit 119 can control the pass/fail check circuit PF so that a pass/fail check is performed using data read from the page buffer circuit 115.

In the case that a bit transmitted to the pass/fail check circuit PF is '0', a memory cell associated with the transmitted bit may be distinguished to be failed. In the case that a bit transmitted to the pass/fail check circuit PF is '1', a memory cell associated with the transmitted bit may be distinguished to be program-passed.

If '0' does not exist in data transmitted from the page buffer circuit 115 or the number of '0's in the data belongs to (or under) the correctable error range, the pass/fail check circuit PF may distinguish that a program of the selected program unit is passed. If '0' exists in data transmitted from the page buffer circuit 115 or the number of '0's in the data does not belong to (or under) the correctable error range, the pass/fail check circuit PF may distinguish that a program of the selected program unit is failed.

If it is determined that the erase of the selected program unit is failed, the counter CNT can count the number of '0's indicating a program fail or the number of '1's indicating a program pass. A counted value may be transmitted to the control logic circuit 119 as verification information VI.

In the step S740, the control logic circuit 119 may determine a method of controlling a level of the program voltage VPGM. For example, the control logic circuit 119 may select one of an increase and a decrease of the program voltage VPGM.

In the case that the control logic circuit 119 selects an increase of the program voltage VPGM, in the step S750, the voltage control circuit VC increases a level of the program voltage VPGM. In the case that the control logic circuit 119 selects a decrease of the program voltage VPGM, in the step S760, the voltage control circuit VC decreases a level of the program voltage VPGM. After that, the step S710 is performed again.

In short, the control logic circuit 119 can control a level of a program voltage VPGM of a next program loop based on the verification information VI of the current program loop. For example, according to the verification information VI of the current program loop, the control logic circuit 119 can increase or decrease a program voltage VPGM of a next program loop compared with the program voltage VPGM of the current program loop.

Figure 14:
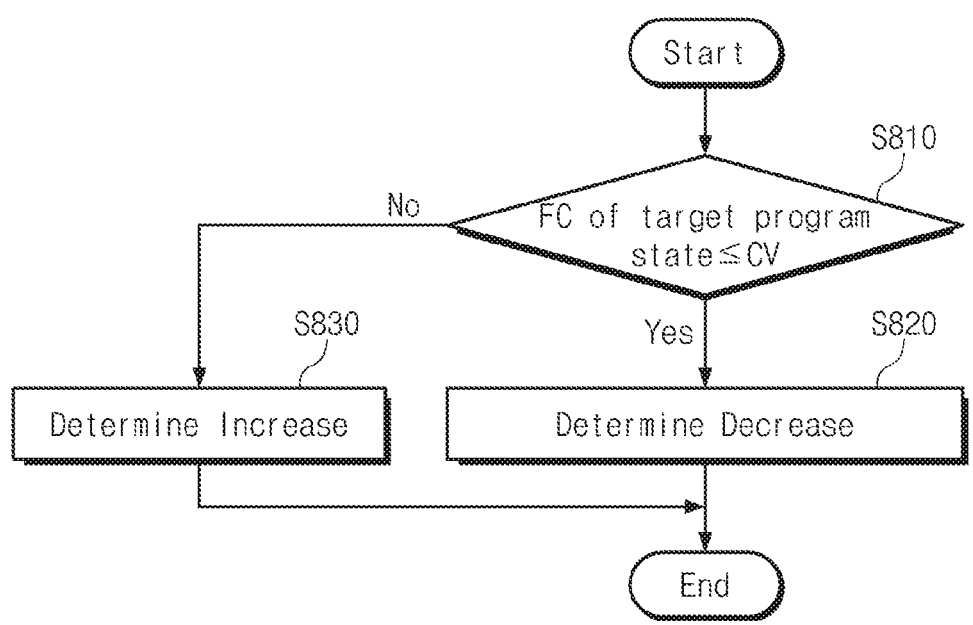
FIG. 14 illustrates an example of determining a method of controlling a program voltage in a program operation of FIG. 13.

FIG. 14 illustrates an example of determining a method of controlling a program voltage in a program operation of FIG. 13. Referring to FIGS. 1 and 14, the control logic circuit 119 may receive the number of fail cells FC of a target program state from the pass/fail check circuit PF as verification information VI. For example, threshold voltages of programmed memory cells may belong to different distribution ranges depending on a program state. That is, except an erase state, the program states correspond to different distribution ranges of threshold voltages of programmed memory cells. The target program state may be a program state providing verification information VI being used to determine a control method of the program voltage VPGM among the program states. For example, among the program states, a program state which is not programmed and has a distribution range of the lowest threshold voltages may be a target program state.

In a step S810, the control logic circuit 119 distinguishes whether the number of fail cells FC of the target program state is smaller than a critical value CV. If the number of fail cells FC of the target program state is smaller than the critical value CV, in a step S820, the control logic circuit 119 may select a decrease as a control method of the program voltage VPGM. If the number of fail cells FC of the target program state is greater than the critical value CV, in a step S830, the control logic circuit 119 may select an increase as a control method of the program voltage VPGM.

For example, the critical value CV may be determined as a ratio with respect to the number of memory cells being programmed to the target program state. For example, the critical value CV may be one-third of the number of memory cells being programmed to the target program state.

Figure 15:
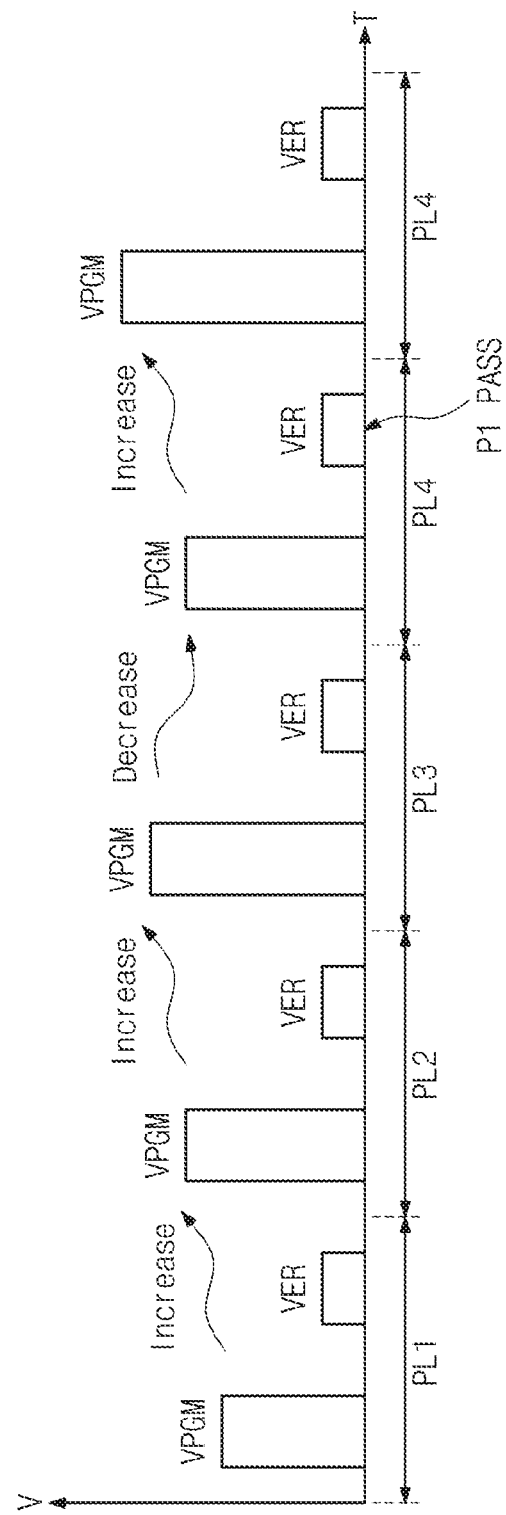
FIG. 15 is a timing diagram illustrating a process in which a program loop is repeated in a program unit selected according to a program operation method illustrated in FIG. 13.

FIG. 15 is a timing diagram illustrating a process in which a program loop is repeated in a program unit selected according to a program operation method illustrated in FIG. 13. In FIG. 15, a horizontal axis indicates time (T) and a vertical axis indicates a voltage (V) being applied to memory cells MC of a selected program unit.

For brevity of description, in FIG. 15, other voltages are omitted except that in each program loop PL, a program voltage VPGM is applied to memory cells MC and a program verification voltage VER corresponding to a target program state is applied.

Referring to FIGS. 1 and 15, in a first program loop PL1, an increase of the program voltage VPGM may be selected. In a second program loop PL2, an increase of the program voltage VPGM may be selected. In a third program loop PL3, a decrease of the program voltage VPGM may be selected.

For example, in a K program loop of a first time (T1), a decrease of the program voltage VPGM may be determined. After that, a level of the program voltage VPGM being applied in a K+1 program loop may be lower than a level of the program voltage VPGM of the K program loop. After that, as a program loop is repeated, a level of the program voltage VPGM may gradually decrease.

As another example, in the K program loop of the first time (T1), a decrease of the program voltage VPGM may be determined. After that, a level of the program voltage VPGM being applied in a K+1 program loop may be lower than a level of the program voltage VPGM of the K program loop. After that, as a program loop is repeated, a level of the program voltage VPGM of the K+1 program loop may be maintained.

That is, as a program loop is repeated after a decrease of the program voltage VPGM is decided, a level of the program voltage VPGM may continuously decrease or may maintain a specific value after it is decreased by the predetermined number of times.

If a program of memory cells being programmed to the target program state is passed, a control of the program voltage VPGM may be initialized. For example, a level of the program voltage VPGM may be controlled to the highest level in a previous program loop or a level higher than the highest level. The target program state may be changed to a next program state having a higher distribution range compared with a current program state. The program loop of FIG. 13 may be performed again with respect to the changed target program state. For example, according to the number of fail cells FC of the changed target program state, a control method of the program voltage VPGM may be determined.

In the embodiments described above, it was described that the control method of the program voltage VPGM is decided according to the number of fail cells FC. However, the control method of the program voltage VPGM may be decided according to the number of times a program loop is performed. For example, if during a program operation with respect to a target program state, the number of times a program loop is performed is smaller than a critical value, an increase of the program voltage VPGM may be selected. If during a program operation with respect to a target program state, the number of times a program loop is performed is greater than the critical value, a decrease of the program voltage VPGM may be selected.

Figure 16:
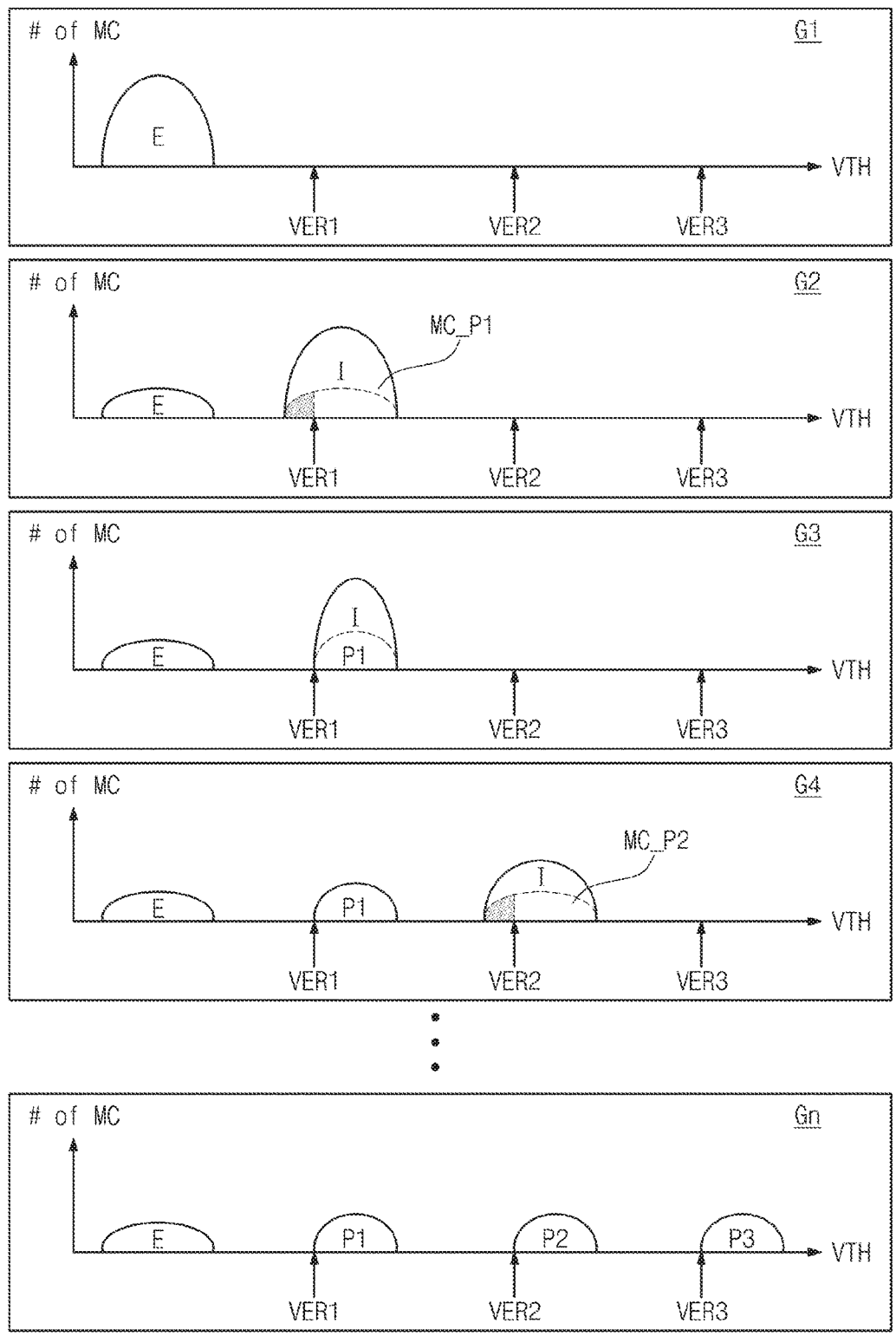
FIG. 16 illustrates graphs showing a process in which memory cells are programmed according to an operation method of FIG. 13.

FIG. 16 illustrates graphs showing a process in which memory cells are programmed according to an operation method of FIG. 13. In each graph of FIG. 16, a horizontal axis indicates a threshold voltage VTH of memory cells MC and a vertical axis indicates the number of memory cells MC.

Referring to a first graph G1, memory cells MC not programmed may have an erase state E. The memory cells MC may be programmed from the erase state E. It is assumed that the memory cells MC are programmed to first through third program states P1~P3. However, the disclosure is not limited thereto. The first through third program states P1~P3 may be program-verified using first through third verification voltages VER1, VER2 and VER3 respectively. If a program operation begins, a target program state may be set into the first program state P1.

Referring to a second graph G2, as a program loop proceeds, threshold voltages of memory cells being programmed to the first through third program states P1~P3 increase. Among memory cells being programmed, memory cells being programmed to the first program state P1 are represented by MC_P1 and memory cells being programmed to the second and third program states P2 and P3 are represented by I.

In the second graph G2, among the memory cells MC_P1 being programmed to the target program state P1, the number of fail cells FC may be smaller than the critical value CV. Thus, the program voltage VPGM may decrease.

As illustrated in a third graph G3, as the program voltage VPGM decreases and a program loop is performed, the increment of threshold voltages of the memory cells MC decreases until the first program state P1 is program-passed. Thus, a distribution width of threshold voltages of memory cells corresponding to the first program state P1 is reduced.

If a program of the first program state P1 is finished, the second program state P2 is set to the target program state. The program voltage VPGM increases again. Thus, threshold voltages of memory cells being programmed to the second and third program states P2 and P3 rapidly increase.

In a fourth graph G4, memory cells being programmed to the second program state P2 are represented by MC_P2 and memory cells being programmed to the third program state P3 are represented by I.

In the fourth graph G4, among the memory cells MC_P2 being programmed to a target program state P2, the number of fail cells FC may be smaller than the critical value CV. Thus, the program voltage VPGM may decrease.

As the program voltage VPGM decreases and a program loop proceeds, a distribution width of threshold voltages of memory cells programmed to the second program state P2 is reduced. Similarly, a distribution width of threshold voltages of memory cells programmed to the third program state P3 is reduced, as illustrated in the $n^{th}$ graph Gn.

In the embodiments described above, it was described that all the program states P1~P3 may be selected as a target program state. However, the target program state may be selected from at least one of the program states P1~P3. For example, only the third program state P3 having the largest distribution range may be selected as the target program state. As another example, the target program state may be selected from k (k is a positive integer) number of program states having the largest distribution range.

As described with reference to FIGS. 9 through 11, a control method of the program voltage VPGM associated with the target program state may be selected among an increase, maintenance and a decrease. As described with reference to FIG. 12, a control method of the program voltage VPGM associated with the target program state may be performed based on a step.

Figure 17:
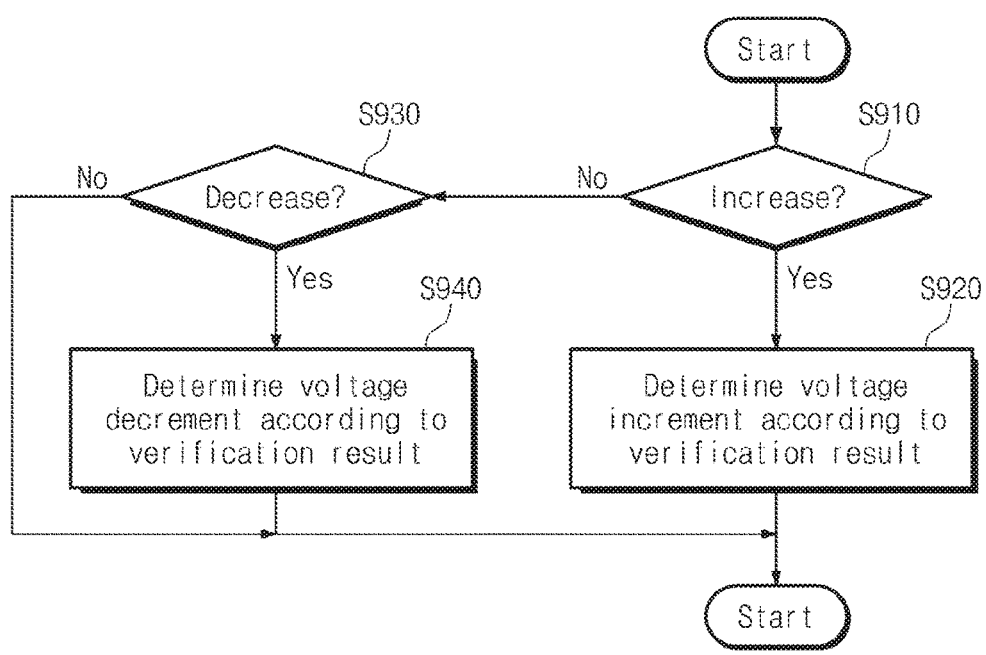
FIG. 17 is a flowchart illustrating an example that when a voltage increases or is reduced, an increment or a decrement is controlled.

FIG. 17 is a flowchart illustrating an example that when a voltage increases or is reduced, an increment or a decrement is controlled. Referring to FIG. 17, in a step S910, it is distinguished whether an erase or program voltage increases. If an erase or program voltage increases, in a step S920, a voltage increment is determined according to a verification result.

For example, if the number of pass cells is greater than a k critical value (k is a positive integer), a k voltage increment may be selected. If the number of pass cells is greater than a k+1 critical value higher than the k critical value, a k+1 voltage increment may be selected. The k+1 voltage increment may be smaller than the k voltage increment.

In a step S930, it is distinguished whether an erase or program voltage decreases. If an erase or program voltage decreases, in a step S940, a voltage decrement is determined according to a verification result.

For example, if the number of pass cells is greater than a k critical value (k is a positive integer), a k voltage decrement may be selected. If the number of pass cells is greater than a k+1 critical value higher than the k critical value, a k+1 voltage decrement may be selected. The k+1 voltage decrement may be greater than the k voltage decrement.

In FIG. 17, it was described that an increment or a decrement of an erase or program voltage is determined according to an erase or program verification result. However, an increment or a decrement of an erase or program voltage may be determined according to the number of times an erase or program loop is performed or a level of an erase or program voltage.

Figure 18:
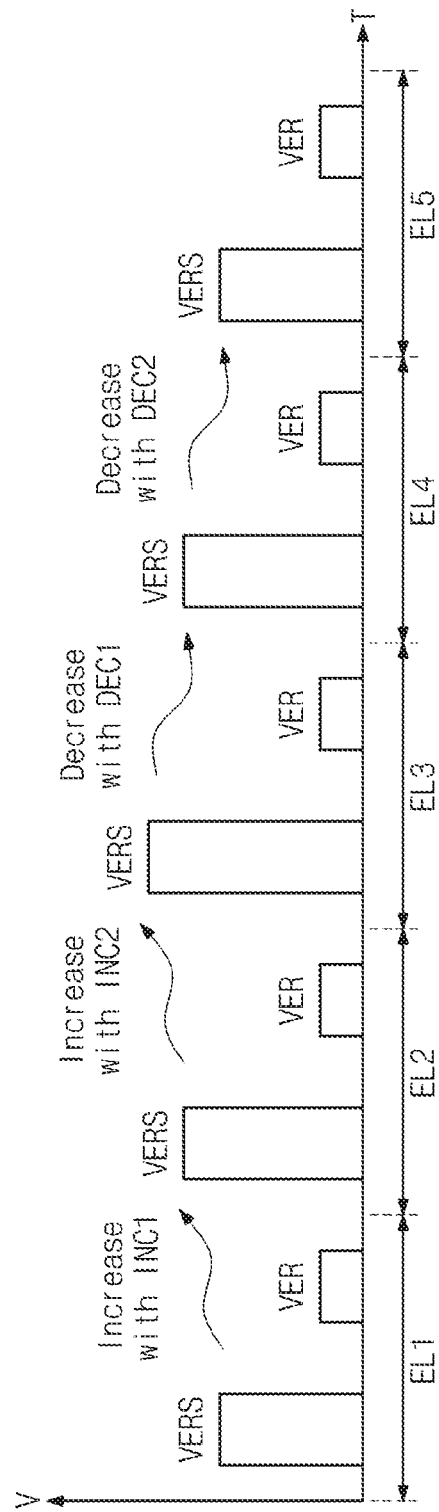
FIG. 18 is a timing diagram illustrating an example that an erase voltage or a program voltage increases or decreases according to the method illustrated in FIG. 17.

FIG. 18 is a timing diagram illustrating an example that an erase voltage or a program voltage increases or decreases according to the method illustrated in FIG. 17. In FIG. 18, a horizontal axis indicates time (T) and a vertical axis indicates a voltage (V) being applied to memory cells MC of a selected erase unit. An example that an increment or a decrement of the erase voltage VERS is controlled while first through fifth erase loops EL1~EL5 are performed is illustrated in FIG. 18. Each erase loop includes a period in which the erase voltage VERS is applied and a period in which a verification voltage VER is applied.

Referring to FIGS. 17 and 18, when the second erase loop EL2 is performed after the first erase loop EL1 is performed, the erase voltage VERS may increase by a first increment INC1. When the third erase loop EL3 is performed after the second erase loop EL2 is performed, the erase voltage VERS may increase by a second increment INC2. The second increment INC2 may be smaller than the first increment INC.

When the fourth erase loop EL4 is performed after the third erase loop EL3 is performed, the erase voltage VERS may decrease by a first decrement DEC1. When the fifth erase loop EL5 is performed after the fourth erase loop EL4 is performed, the erase voltage VERS may decrease by a second decrement DEC2. The second decrement DEC2 may be greater than the first decrement DEC1.

In FIG. 18, it is illustrated that an increment or a decrement of the erase voltage VERS is controlled every time the erase loop EL is performed. However, an increment or a decrement of the erase voltage VERS is not limited to be controlled every time the erase loop EL is performed. As described with reference to the steps S920 and S940 of FIG. 17, an increment or a decrement of the erase voltage VERS may be controlled when an erase verification result satisfies a specific condition.

As described above, as an erase voltage or a program voltage increases, an increment of the erase voltage or the program voltage may gradually decrease. As an erase voltage or a program voltage decreases, a decrement of the erase voltage or the program voltage may gradually increase.

Figure 19:
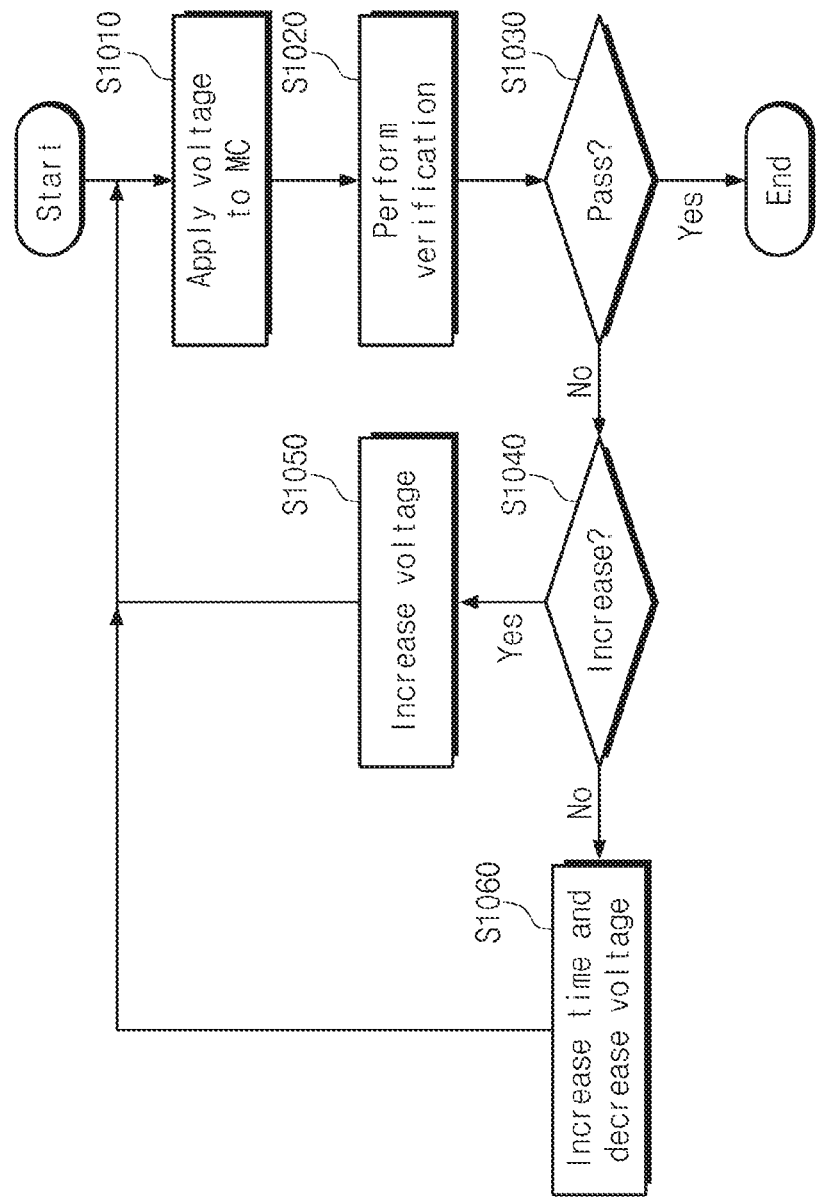
FIG. 19 is a flowchart illustrating an operation method of a nonvolatile memory device in accordance with a sixth embodiment of the disclosure.

FIG. 19 is a flowchart illustrating an operation method of a nonvolatile memory device in accordance with a sixth embodiment of the disclosure. Referring to FIGS. 1, 3 and 19, in a step S1010, an erase or program voltage is applied to memory cells MC. In a step S1020, an erase or program verification is performed. In a step S1030, it is distinguished whether the memory cells MC are erase-passed or program-passed. In the case that the memory cells MC are not erase-passed or program-passed, a step S1040 is performed.

In the step S1040, it is distinguished whether an erase or program voltage increases. For example, N (N is a positive integer) number of ranges may be set. In the case that the number of pass cells moves within the range, it is determined that an erase or program voltage increases. For example, according to an erase or program verification of an i erase or i program loop (i is a positive integer), the number of pass cells may belong to a k range (k is a positive integer which is equal to or smaller than N). According to an erase or program verification of an i+1 erase or i+1 program loop, when the number of pass cells belongs to the k range, it may be determined that an erase or program voltage increases, as illustrated by step S1050.

In the case that the number of pass cells moves to another range, it is determined that an erase or program voltage decreases. For example, according to an erase or program verification of an i erase or i program loop, the number of pass cells may belong to a k range. According to an erase or program verification of an i+1 erase or i+1 program loop, when the number of pass cells belongs to the k+1 range, it may be determined that an erase or program voltage decreases.

If it is determined that an erase or program voltage decreases, in a step S1060, an erase or program voltage is controlled, and an application time of the erase or program voltage increases. A level of the erase or program voltage may be reset to a predetermined initial value or a predetermined middle value.

In FIG. 19, it was described that an increase or a decrease of the erase or program voltage is determined according to an erase or program verification result. However, an increment or a decrement of the erase or program voltage may be determined according to the number of times an erase or program loop is performed or a level of the erase or program voltage.

Figure 20:
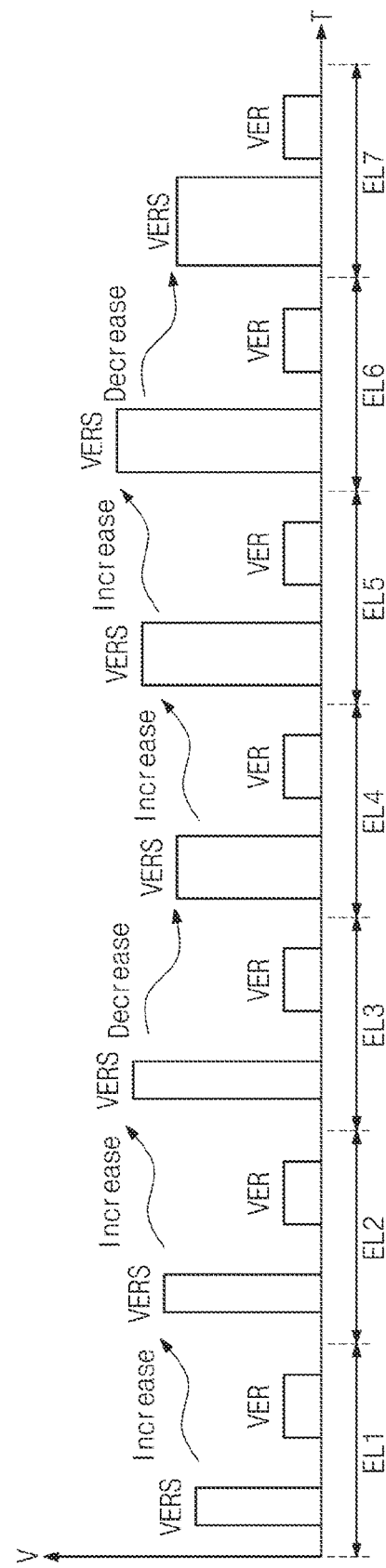
FIG. 20 is a timing diagram illustrating an example that an erase voltage or a program voltage increases or decreases according to the method illustrated in FIG. 19.

FIG. 20 is a timing diagram illustrating an example that an erase voltage or a program voltage increases or decreases according to the method illustrated in FIG. 19. In FIG. 20, a horizontal axis indicates time (T) and a vertical axis indicates a voltage (V) being applied to memory cells MC of a selected erase unit. An example that a level and application time of the erase voltage VERS are changed when first through sixth erase loops EL1~EL6 are performed is illustrated in FIG. 20. Each erase loop includes a period in which the erase voltage VERS is applied and a period in which a verification voltage VER is applied.

Referring to FIGS. 19 and 20, while the first through third erase loops EL1~EL3 are performed, the erase voltage VERS may increase and application time of the erase voltage VERS may be maintained.

When the fourth erase loop EL4 is performed after the third erase loop EL3 is performed, the erase voltage VERS may decrease to an initial value or a middle value between the initial value and the previous value, and application time of the erase voltage VERS may increase.

While the fourth through sixth erase loops EL4~EL6 are performed, the erase voltage VERS may increase and application time of the erase voltage VERS may be maintained.

In FIG. 20, it is illustrated that a decrease of the erase voltage VERS and an increase of application time of the erase voltage VERS occur every time three erase loops are performed. However, the decrease of the erase voltage VERS and the increase of application time of the erase voltage VERS are not limited to this cyclic frequency. As described with reference to the step S1040 of FIG. 19, the decrease of the erase voltage VERS and the increase of application time of the erase voltage VERS may occur when an erase verification result satisfies a specific condition.

As described above, an erase or program voltage may increase while maintaining application time until an erase verification result or a program verification result satisfies a specific condition. Every time the erase verification result or the program verification result satisfies the specific condition, an application time of the erase or program voltage may increase and a level of the erase or program voltage may decrease to an initial value or middle value. Every time the level of the erase or program voltage decreases, an erase or program operation may perform a more sophisticated erase or program.

As described with reference to FIGS. 17 and 18, while an erase or program voltage increases, an increment of the erase or program voltage may be controlled.

Figure 21:
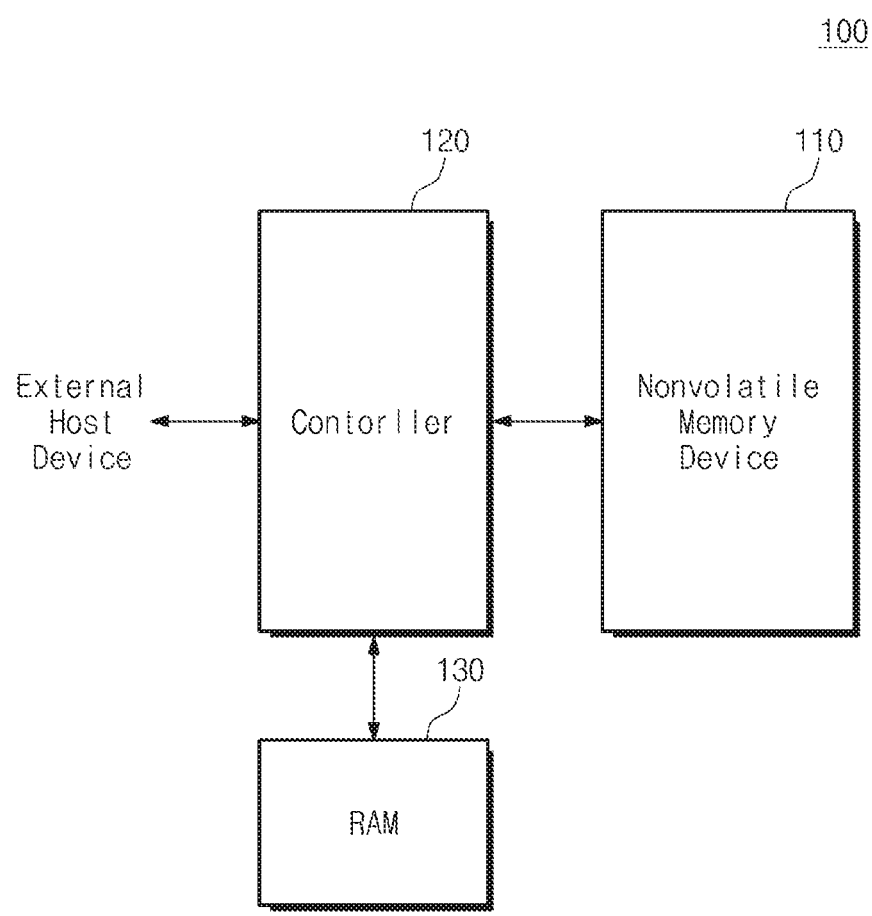
FIG. 21 is a block diagram illustrating a storage device in accordance with some embodiments of the disclosure.

FIG. 21 is a block diagram illustrating a storage device in accordance with some embodiments of the disclosure. Referring to FIG. 21, a storage device 100 includes a nonvolatile memory device 110, a controller 120 and a RAM 130.

The nonvolatile memory device 110 may perform write, read and erase operations under the control of the controller 120. The nonvolatile memory device 110 may receive a command and an address from the controller 120 through an input/output channel. The nonvolatile memory device 110 can exchange data with the controller 120 through the input/output channel.

The nonvolatile memory device 110 can exchange a control signal with the controller 120 through a control channel. For example, the nonvolatile memory device 110 can receive at least one of a chip select signal /CE selecting at least one semiconductor chip among a plurality of semiconductor chips constituting the nonvolatile memory device 110, a command latch enable signal CLE indicating that a signal being received from the controller 120 is the first command CMD1, an address latch enable signal ALE indicating that a signal being received from the controller 120 is the first address ADDR1, a read enable signal /RE which is generated by the controller 120 in a read operation and periodically toggled to be used to adjust the timing, a write enable signal /WE activated by the memory controller 120 when the first command CMD1 or the first address ADDR1 is transmitted, a write preventing signal /WP activated by the controller 120 to prevent an unwanted erase or an unwanted write when a power supply is changed, and a data strobe signal DQS which is generated by the controller 120 in a write operation and is periodically toggled to be used to adjust an input sync of the first data DATA1 from the controller 120. For example, the nonvolatile memory device 110 can output at least one of a ready & busy signal R/nB indicating whether the nonvolatile memory device 110 performs a program, erase or read operation, and a data strobe signal DQS which is generated from the read enable signal /RE by the nonvolatile memory device 110 and is periodically toggled to be used to adjust an output sync of the first data DATA1 to the controller 120.

The nonvolatile memory device 110 may include a flash memory. However, the nonvolatile memory device 110 is not limited to include a flash memory. The nonvolatile memory device 110 may include at least one of various nonvolatile memories such as a PRAM (phase-change RAM), an MRAM (magnetic RAM), an RRAM (resistive RAM), an FeRAM (ferroelectric RAM), etc.

The controller 120 is configured to control the nonvolatile memory device 110. For example, the controller 120 can control the nonvolatile memory device 110 to perform a write, read, or erase operation through the input/output channel and the control channel.

The controller 120 can control the nonvolatile memory device 110 under the control of an external host device (not shown). For example, the controller 120 can communicate with the external host device according to a format used when communicating with the nonvolatile memory device 110 and other formats. A unit of data exchanged when the controller 120 communicates with the nonvolatile memory device 110 may be different from a unit of data exchanged when the controller 120 communicates with external host device.

The controller 120 can use the RAM 130 as a buffer memory, a cache memory, or an operation memory. The controller 120 can store data or codes needed to manage the nonvolatile memory device 110 in the RAM 130. For example, the controller 120 can read data or codes needed to manage the nonvolatile memory device 110 from the nonvolatile memory device 110 and can load the read data into the RAM 130 to drive it.

The RAM 130 may include at least one of various random access memories such as a DRAM (dynamic RAM), an SRAM (static RAM), an SDRAM (synchronous DRAM), a PRAM (phase-change RAM), an MRAM (magnetic RAM), an RRAM (resistive RAM), an FeRAM (ferroelectric RAM), etc.

The storage device 100 may include a SSD (solid state drive) or an HDD (hard disk drive). The storage device 100 may include memory cards such as a personal computer memory card international association (PCMCIA) card, a compact flash (CF) card, a smart media card (SM, SMC), a memory stick, a multimedia card (MMC, RS-MMC, MMC-micro), an SD card (SD, miniSD, microSD, SDHC), a universal flash memory device (UFS), etc. The storage device 100 may include a mounted memory such as an eMMC (embedded multimedia card), a UFS, a PPN (perfect page new), etc.

In FIG. 21, it is illustrated that the storage device 100 includes the RAM 130 disposed outside the controller 120. However, the storage device 100 may not include the RAM 130 disposed outside the controller 120. The controller 120 may be configured to use an internal RAM as a buffer memory, an operation memory, or a cache memory.

In FIGS. 1 through 16, it was described that selecting a control method of the erase voltage VERS or the program voltage VPGM is performed by the nonvolatile memory device 110. However, selecting a control method of the erase voltage VERS or the program voltage VPGM may be performed by the controller 120.

Figure 22:
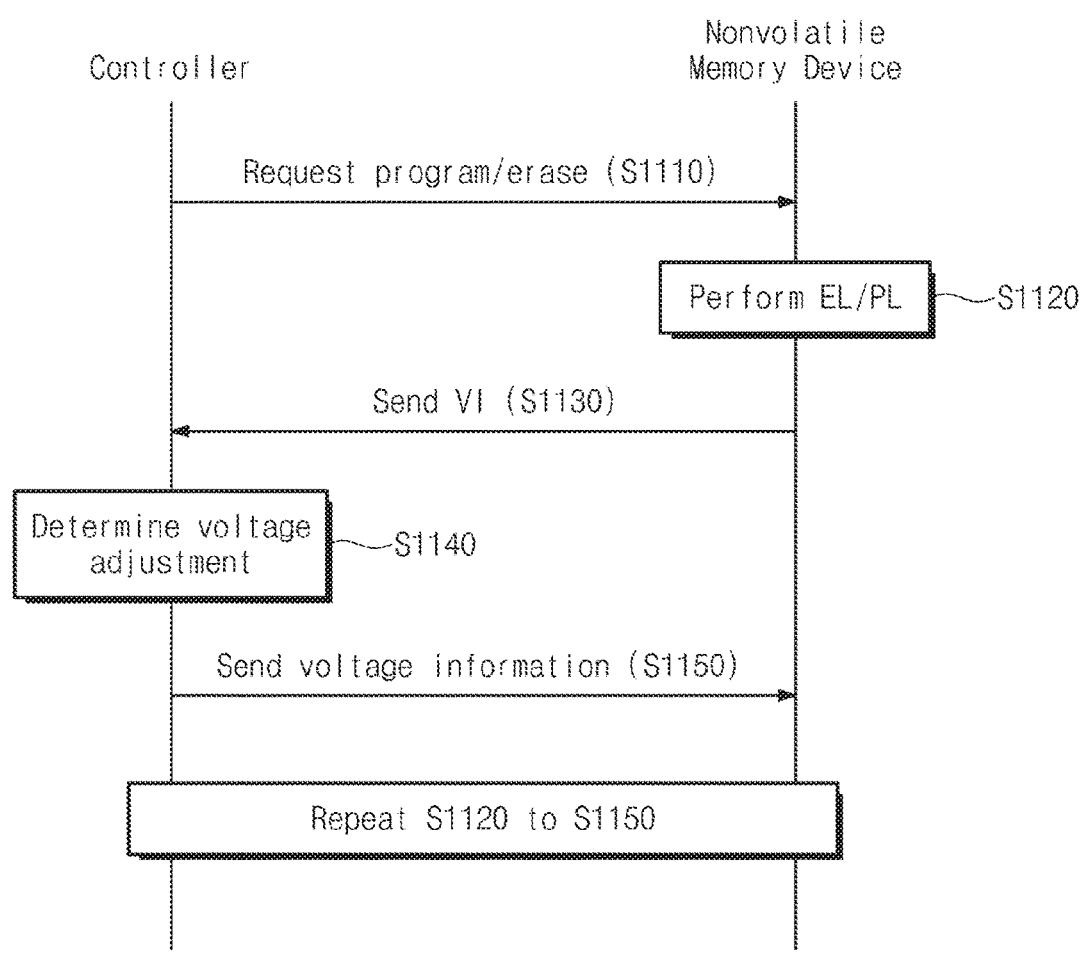
FIG. 22 illustrates a first example that a controller selects a method of controlling an erase voltage or a program voltage.

FIG. 22 illustrates a first example that a controller selects a method of controlling an erase voltage or a program voltage. Referring to FIGS. 21 and 22, in a step S1110, the controller 120 may request a program or an erase at the nonvolatile memory device 110.

In a step S1120, the nonvolatile memory device 110 may perform an erase loop EL or a program loop PL.

In a step S1130, the nonvolatile memory device 110 may output verification information VI to the controller 120.

In a step S1140, the controller 120 can distinguish whether a control of the erase voltage VERS or the program voltage VPGM is needed.

In a step S1150, the controller 120 can transmit the distinguished control information to the nonvolatile memory device 110. For example, the control information may include information about a controlled amount of the erase voltage VERS or the program voltage VPGM, information about whether to increase, maintain, or decrease the erase voltage VERS or the program voltage VPGM, or information about a step of an erase operation or a program operation.

After that, the erase operation or the program operation may be performed while repeating the steps S1120 through S1150.

That is, the nonvolatile memory device 110, after erase verification or program verification is performed, can output verification information VI to the controller 120. The controller 120 distinguishes a control method of the erase voltage VERS or the program voltage VPGM and can control the nonvolatile memory device 110 to control the erase voltage VERS or the program voltage VPGM according to the distinguished control method.

Figure 23:
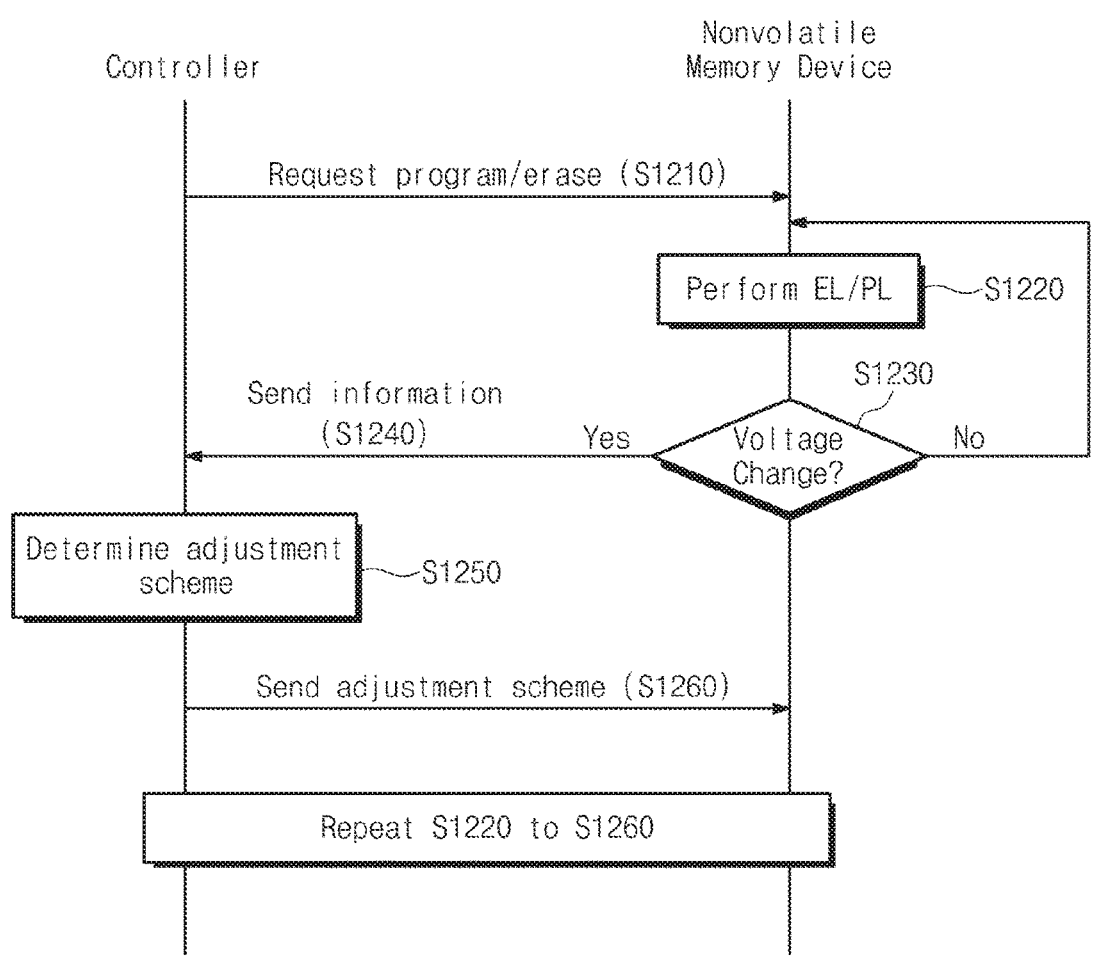
FIG. 23 illustrates a second example that a controller selects a method of controlling an erase voltage or a program voltage.

FIG. 23 illustrates a second example whereby a controller selects a method of controlling an erase voltage or a program voltage. Referring to FIGS. 21 and 23, in a step S1210, the controller 120 may request a program or an erase at the nonvolatile memory device 110.

In a step S1220, the nonvolatile memory device 110 may perform an erase loop EL or a program loop PL.

In a step S1230, on the basis of the verification information VI, the nonvolatile memory device 110 can distinguish whether a selection of a voltage control method is needed. In the case that a selection of a voltage control method is not needed, the nonvolatile memory device 110 can perform an erase loop EL or a program loop PL in the step S1220 again.

In the case that a selection of a voltage control method is needed, the nonvolatile memory device 110 can transmit, in step S1240, information about a result of the distinction made in step S1230 to the controller 120. For example, the nonvolatile memory device 110 can transmit information about whether to increase, maintain, or decrease the erase voltage VERS or the program voltage VGPM, information about erase loops or program loops performed until now, information about a current erase voltage VERS or a current program voltage VPGM, etc. to the controller 120.

In a step S1250, the controller 120 can select a control method of the erase voltage VERS or the program voltage VPGM.

In a step S1260, the controller 120 can transmit control information about the voltage control method to the nonvolatile memory device 110. For example, the control information may include information about a controlled amount of the erase voltage VERS or the program voltage VPGM, information about whether to increase, maintain, or decrease the erase voltage VERS or the program voltage VPGM, or information about a step of an erase operation or a program operation.

After that, the erase operation or the program operation may be performed while repeating the steps S1220 through S1260.

That is, while sequentially performing an erase loop or a program loop, the nonvolatile memory device 110 can distinguish whether a change of a control method of the erase voltage VERS or the program voltage VPGM is needed. In the case that a change of a control method is needed, the nonvolatile memory device 110 may transmit information associated with the control method to the controller 120. After that, the nonvolatile memory device 110 may change the voltage control method under the control of the controller 120.

Figure 24:
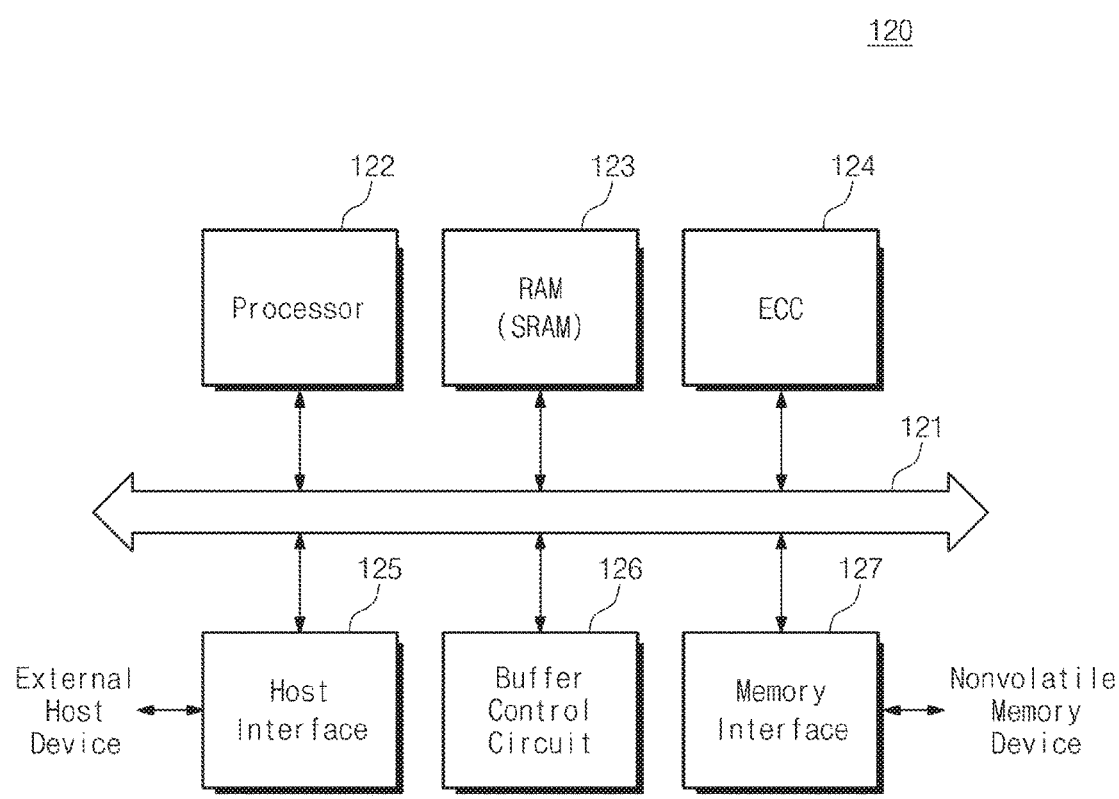
FIG. 24 is a block diagram illustrating a controller in accordance with some embodiments of the disclosure.

FIG. 24 is a block diagram illustrating a controller in accordance with some embodiments of the disclosure. Referring to FIGS. 21 and 24, the controller 120 includes a bus 121, a processor 122, a RAM 123, an ECC (error correction code) block 124, a host interface 125, a buffer control circuit 126, and a memory interface 127.

The processor 122 can control an overall operation of the memory controller 120 and perform a logical operation. The processor 122 can communicate with an external host device through the host interface 125, communicate with the nonvolatile memory device 110 through the memory interface 127, and communicate with the RAM 130 through the buffer control circuit 126. The processor 122 can use the RAM 123 as an operation memory, a cache memory, or a buffer memory to control the storage device 100.

The RAM 123 may be used as an operation memory, a cache memory, or a buffer memory of the processor 122. The RAM 123 can store codes and commands being executed by the processor 122. The RAM 123 can store data being processed by the processor 122. The RAM 123 may include an SRAM (static RAM).

The ECC block 124 can perform an error correction operation. The ECC block 124 can perform error correction encoding on the basis of data to be written in the nonvolatile memory device 110 through the memory interface 127. The error correction encoded data may be transmitted to the nonvolatile memory device 110 through the memory interface 127. The ECC block 124 can perform error correction decoding on data being received from the nonvolatile memory device 110 through the memory interface 127. The ECC block 124 may be included in the memory interface 127 as a constituent element of the memory interface 127.

The host interface 125 may be configured to communicate with an external host device under the control of the processor 122. The host interface 125 may be configured to perform a communication using at least one of various communication methods such as a universal serial bus (USB), a serial at attachment (SATA), a serial attachment SCSI (SAS), a high speed interchip (HSIC), a small computer small interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a DIMM (dual in-line memory module), an RDIMM (registered DIMM), an LRDIMM (road reduced DIMM), etc.

The buffer controller circuit 126 is configured to control the RAM 130 under the control of the processor 122.

The memory interface 127 is configured to communicate with the nonvolatile memory 110. As described with reference to FIG. 1, the memory interface 127 can exchange a command, an address, and data with the nonvolatile memory device 110 through an input/output channel. The memory interface 127 can exchange a control signal with the nonvolatile memory device 110 through a control channel.

In the case that the RAM 130 is not provided to the storage device 100, the buffer control circuit 126 may not be provided to the controller 120.

As an illustration, the processor 122 can control the controller 120 using codes. The processor 122 can load codes from nonvolatile memory (for example, read only memory) disposed inside the controller 120. As another illustration, the processor 122 can load codes being received from the nonvolatile memory device 110 through the memory interface 127.

The bus 121 of the memory controller 120 may be divided into a control bus and a data bus. The data bus may be configured to transmit data in the memory controller 120 and the control bus may be configured to transmit control information such as a command, an address, etc. in the memory controller 120. The data bus and the control bus may be separated from each other and may not interfere with or affect each other. The data bus may be connected to the host interface 125, the buffer control circuit 126, the ECC (error correction code) block 124, and the memory interface 127. The control bus may be connected to the host interface 125, the processor 122, the buffer control circuit 126, RAM 123, and the memory interface 127.

Figure 25:
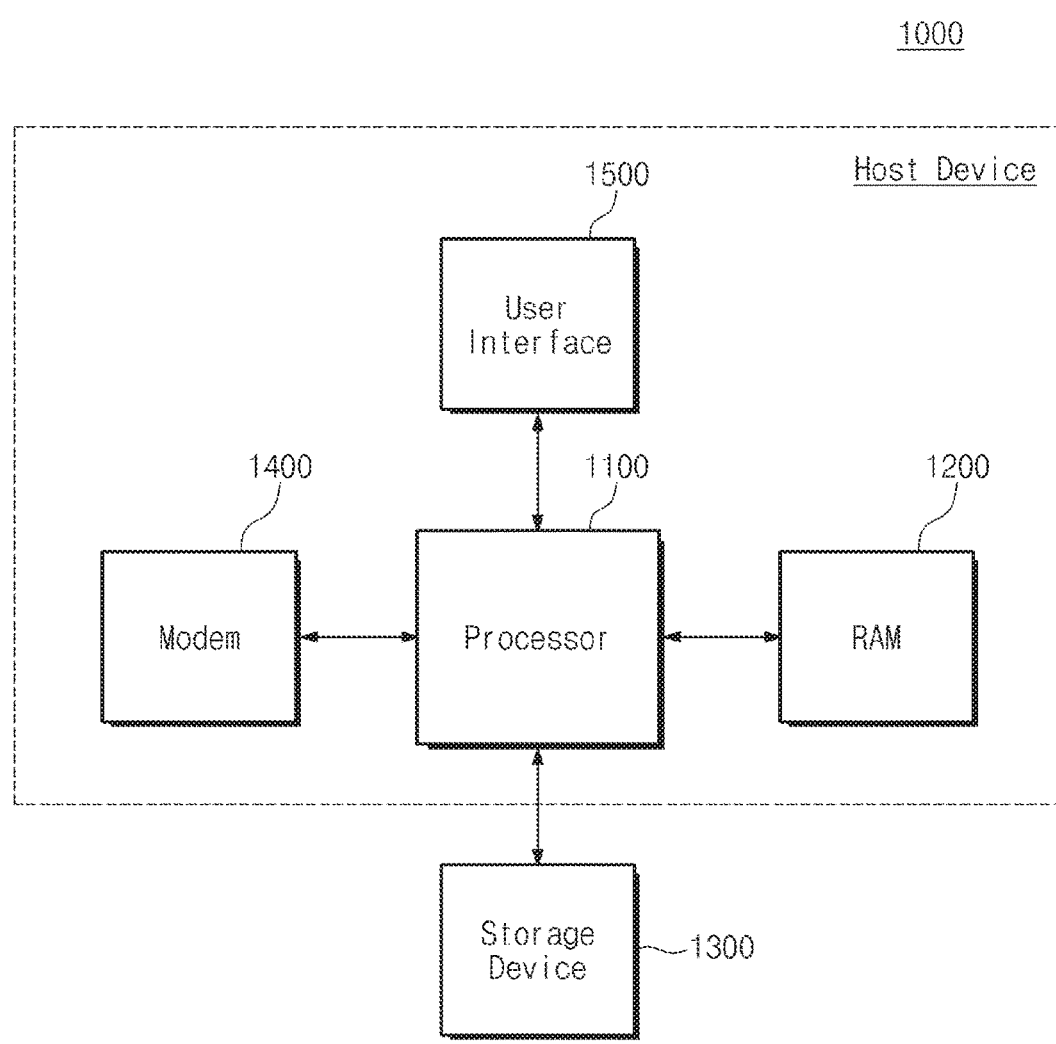
FIG. 25 is a block diagram illustrating a computing device in accordance with some embodiments of the disclosure.

FIG. 25 is a block diagram illustrating a computing device in accordance with some embodiments of the disclosure. Referring to FIG. 25, the computing device 1000 includes a processor 1100, a memory 1200, a storage device 1300, a modem 1400, and a user interface 1500.

The processor 1100 can control an overall operation of the computing device 1000 and perform a logical operation. For example, the processor 1100 can be constituted by a system-on-chip SoC. The processor 1100 may be a general purpose processor, a special purpose processor, or an application processor.

The RAM 1200 can communicate with the processor 1100. The RAM 1200 may be a main memory of the processor 1100 or the computing device 1000. The processor 1100 can temporarily store a code or data in the RAM 1200. The processor 1100 can execute a code and process data using the RAM 1200. The processor 1100 can execute various software such as an operating system, an application, etc. using the RAM 1200. The processor 1100 can control an overall operation of the computing device 1000 using the RAM 1200. The RAM 1200 may include a volatile memory such as an SRAM, a DRAM, an SDRAM, etc. or a nonvolatile memory such as a PRAM, an MRAM, an RRAM, an FeRAM, etc.

The storage device 1300 can communicate with the processor 1100. The storage device 1300 can store data which has to be stored for a long time. That is, the processor 1100 can store data which has to be stored for a long time in the storage device 1300. The storage device 1300 can store a boot image to drive the computing device 1000. The storage device 1300 can store source codes of various software such as an operating system, an application, etc. The storage device 1300 can store data processed by various software such as an operating system, an application, etc.

The processor 1100 can drive various software such as an operating system, an application, etc. by loading source codes stored in the storage device 1300 in the RAM 1200 and executing the codes loaded in the RAM 1200. The processor 1100 can load data stored in the storage device 1300 in the RAM 1200 and process data loaded in the RAM 1200. The processor 1100 can store data desired to be preserved for a long time among data stored in the RAM 1200 in the storage device 1300.

The data storage device 1300 may include a nonvolatile memory such as a flash memory, a PRAM, an MRAM an RRAM, an FRAM, etc.

The modem 1400 can perform a communication with an external device according to a control of the processor 1100. For example, the modem 1400 can perform a wired or wireless communication with an external device. The modem 140 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), a PCI express (PCIe), a nonvolatile memory express (NVMe), a universal flash storage (UFS), a secure digital (SD), an SDIO, a universal asynchronous receiver transmitter (UART), an SPI (serial peripheral interface), a high speed SPI (HS-SPI), an RS232, an inter-integrated circuit (I2C), an HS-I2C, an integrated-interchip sound (I2S), a sony/philips digital interface (S/PDIF), a multimedia card (MMC), an embedded MMC (eMMC), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, a piezoelectric element, etc. The user interface 1500 may include user output interfaces such as a liquid crystal display (LCD), an organic light emitting diode (OLED) display, an active matrix OLED (AMOLED) display, a LED, a speaker, a motor, etc.

The storage device 1300 may be embodied by the storage device 100 in accordance with some embodiments of the disclosure. The processor 1100, the RAM 1200, the modem 1400 and the user interface 1500 may form a host device communicating with the storage device 1300.

According to embodiments of the disclosure, memory cells are prevented from being over erased. Thus, a nonvolatile memory device having improved reliability and a storage device including the nonvolatile memory device are provided.

Although a few embodiments of the disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. The present disclosure is defined by the following claims, with equivalents of the claims to be included therein

What is claimed is:

1. A nonvolatile memory device comprising:
a memory cell array including memory cells;
a row decoder circuit connected to the memory cells through word lines;
a page buffer circuit connected to the memory cells through bit lines; and
a control circuit controlling the row decoder circuit and the page buffer circuit to repeatedly perform an erase loop including an erase and an erase verification with respect to the memory cells, wherein:
for a single erase operation of the memory cells:
the control circuit is configured to select one of an increase, maintain, and a decrease of a controlled erase voltage according to a result of an erase verification of a current erase loop and apply the controlled erase voltage to the memory cells in an erase operation of a subsequent erase loop, and
the single erase operation is continued with the controlled erase voltage at the subsequent erase loop after the controlled erase voltage is controlled.

2. The nonvolatile memory device of claim 1, wherein if a number of erase failed memory cells among the memory cells is greater than a reference value according to the result of the erase verification of the current erase loop, the control circuit is configured to select the increase of the controlled erase voltage.

3. The nonvolatile memory device of claim 1, wherein if a number of erase failed memory cells among the memory cells is smaller than a reference value according to the result of the erase verification of the current erase loop, the control circuit is configured to select the decrease of the controlled erase voltage.

4. The nonvolatile memory device of claim 1, wherein if a number of erase failed memory cells among memory cells of a selected group among the memory cells is smaller than a reference value according to the result of the erase verification of the current erase loop, the control circuit is configured to select the decrease of the controlled erase voltage.

5. The nonvolatile memory device of claim 1, wherein:
the control circuit controls the row decoder circuit and the page buffer circuit to repeatedly perform a program loop including a program and a program verification with respect to the memory cells, and
the control circuit is configured to select one of an increase and a decrease of a controlled program voltage according to the result of a program verification of a current program loop and apply the controlled program voltage to the memory cells in a program operation of a subsequent program loop.

6. A nonvolatile memory device comprising:
a memory cell array having memory cells; and
a controller that repeatedly performs, for a single erase operation, an operational loop, comprising a voltage application operation and a verification operation, on the memory cells, wherein, for the single erase operation, the controller:
determines an extent of success achieved by the voltage application operation of a current operational loop from the verification operation of the current operational loop,
selects one of an increase, maintain, and a decrease of a controlled voltage, to be applied in a subsequent operational loop, according to the determined extent of success,
applies the controlled voltage to the memory cells in the voltage application operation of the subsequent operational loop, and
the single erase operation is continued with the controlled voltage at the subsequent operational loop after the controlled voltage is increased, maintained, or decreased.

7. The nonvolatile memory device of claim 6, wherein the controller decreases the controlled voltage upon determining the extent of success achieved by the voltage application operation of the current operational loop exceeds a threshold value.

8. The nonvolatile memory device of claim 7, wherein the controller increases a length of time the controlled voltage will be applied during the subsequent operational loop upon determining that the extent of success achieved by the voltage application operation of the current operational loop exceeds the threshold value.

9. The nonvolatile memory device of claim 6, wherein the controller increases the controlled voltage upon determining the extent of success achieved by the voltage application operation of the current operational loop does not exceed a first threshold value.

10. The nonvolatile memory device of claim 9, wherein the controller:
decreases the controlled voltage upon determining the extent of success achieved by the voltage application operation of the current operational loop exceeds both the first threshold value and a second threshold value that is higher than the first threshold value, and
maintains the controlled voltage upon determining the extent of success achieved by the voltage application operation of the current operational loop exceeds the first threshold value but does not exceed the second threshold value.

11. The nonvolatile memory device of claim 1, wherein an amount of erase voltage applied in the subsequent erase loop is selected based upon a number of erase failed cells or a number of erase passed cells identified in the erase verification of the current erase loop.

12. The nonvolatile memory device of claim 6, wherein an amount of erase voltage applied in the subsequent operational loop is selected based upon a number of erase failed cells or a number of erase passed cells identified in the verification operation of the current operational loop.

* * * * *